United States Patent
Ishizu et al.

(10) Patent No.: US 12,453,182 B2
(45) Date of Patent: Oct. 21, 2025

(54) SEMICONDUCTOR DEVICE

(71) Applicant: SEMICONDUCTOR ENERGY LABORATORY CO., LTD., Atsugi (JP)

(72) Inventors: Takahiko Ishizu, Kanagawa (JP); Kazuma Furutani, Kanagawa (JP); Takayuki Ikeda, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 662 days.

(21) Appl. No.: 17/774,958

(22) PCT Filed: Nov. 5, 2020

(86) PCT No.: PCT/IB2020/060397
§ 371 (c)(1),
(2) Date: May 6, 2022

(87) PCT Pub. No.: WO2021/094878
PCT Pub. Date: May 20, 2021

(65) Prior Publication Data
US 2022/0392925 A1     Dec. 8, 2022

(30) Foreign Application Priority Data

Nov. 15, 2019 (JP) .................. 2019-206615

(51) Int. Cl.
*H01L 27/12* (2006.01)
*H10D 30/67* (2025.01)
*H10D 87/00* (2025.01)

(52) U.S. Cl.
CPC ......... *H10D 87/00* (2025.01); *H10D 30/6734* (2025.01); *H10D 30/6755* (2025.01)

(58) Field of Classification Search
CPC ............. H01L 27/0688; H01L 21/8258; H01L 27/1203; H01L 27/1207; H01L 29/7869;
(Continued)

(56) References Cited

U.S. PATENT DOCUMENTS 7,511,558 B2  3/2009  Itoh et al.
7,911,024 B2  3/2011  Ho et al.
(Continued)

FOREIGN PATENT DOCUMENTS

EP    3429080 A        1/2019
JP    2007-110009 A    4/2007
(Continued)

OTHER PUBLICATIONS

International Search Report (Application No. PCT/IB2020/060397) Dated Feb. 2, 2021.
(Continued)

*Primary Examiner* — Jaehwan Oh
(74) *Attorney, Agent, or Firm* — Fish & Richardson P.C.

(57) ABSTRACT

A semiconductor device with a novel structure is provided. The semiconductor device includes a memory circuit including a first transistor and a second transistor. The first transistor is formed on a silicon substrate. The second transistor is formed in a layer above a layer where the first transistor is provided. The first transistor includes a first gate electrode and a first back gate electrode with a first channel formation region interposed therebetween. The first gate electrode is electrically connected to one of a source and a drain of the second transistor. The first back gate electrode is formed using a region where an impurity element imparting a conductivity type is selectively introduced in the silicon substrate. The second transistor includes a second channel formation region. The second channel formation region includes a metal oxide.

7 Claims, 12 Drawing Sheets

(58) Field of Classification Search
CPC ......... H01L 21/76831; H01L 29/78648; H01L 21/84
See application file for complete search history.

(56) References Cited

U.S. PATENT DOCUMENTS

| | | | |
|---|---|---|---|
| 8,575,699 | B2 | 11/2013 | Chan et al. |
| 9,024,386 | B2 | 5/2015 | Horita et al. |
| 9,385,592 | B2 | 7/2016 | Watanabe et al. |
| 9,484,271 | B2 | 11/2016 | Horita et al. |
| 9,646,679 | B2 | 5/2017 | Kamohara et al. |
| 9,685,500 | B2 | 6/2017 | Yamazaki et al. |
| 9,837,890 | B2 | 12/2017 | Watanabe et al. |
| 9,959,924 | B2 | 5/2018 | Kamohara et al. |
| 10,121,705 | B2 | 11/2018 | Shinohara et al. |
| 10,311,943 | B2 | 6/2019 | Kamohara et al. |
| 10,366,914 | B2 | 7/2019 | Makiyama |
| 11,184,002 | B2 | 11/2021 | Bora et al. |
| 11,373,700 | B2 | 6/2022 | Kamohara et al. |
| 11,676,655 | B2 | 6/2023 | Kamohara et al. |
| 2011/0176348 | A1 | 7/2011 | Yamazaki et al. |
| 2013/0119470 | A1* | 5/2013 | Horita ............... H10D 86/01 257/347 |
| 2015/0054571 | A1* | 2/2015 | Watanabe ........... H02M 3/07 327/536 |
| 2015/0137239 | A1 | 5/2015 | Shinohara et al. |
| 2015/0263007 | A1* | 9/2015 | Yamazaki ........... H10D 88/00 257/43 |
| 2016/0099258 | A1 | 4/2016 | Yoneda |
| 2016/0155850 | A1 | 6/2016 | Yamazaki |
| 2016/0180923 | A1 | 6/2016 | Kamohara et al. |
| 2016/0380108 | A1* | 12/2016 | Yamazaki ........... H10D 30/611 257/43 |
| 2017/0098712 | A1* | 4/2017 | Zhou ............... H10D 30/031 |
| 2019/0238044 | A1 | 8/2019 | Mckay et al. |
| 2020/0313000 | A1 | 10/2020 | Uejima et al. |
| 2022/0077191 | A1 | 3/2022 | Tsuchiya et al. |
| 2022/0406936 | A1 | 12/2022 | Uejima et al. |
| 2024/0363750 | A1 | 10/2024 | Uejima et al. |

FOREIGN PATENT DOCUMENTS

| | | |
|---|---|---|
| JP | 2013-105982 A | 5/2013 |
| JP | 2015-103555 A | 6/2015 |
| JP | 2015-164386 A | 9/2015 |
| JP | 2015-222807 A | 12/2015 |
| JP | 2016-115891 A | 6/2016 |
| JP | 2018-142575 A | 9/2018 |
| WO | WO-2015/136412 | 9/2015 |
| WO | WO-2019/012140 | 1/2019 |
| WO | WO-2019/097568 | 5/2019 |

OTHER PUBLICATIONS

Written Opinion (Application No. PCT/IB2020/060397) Dated Feb. 2, 2021.

Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics), 2012, vol. 51, pp. 021201-1-021201-7.

Ishizu.T et al., "Embedded Oxide Semiconductor Memories: A Key Enabler for Low-Power ULSI", ECS Transactions, May 21, 2017, vol. 79, No. 1, pp. 149-156, The Electrochemical Society.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

* cited by examiner

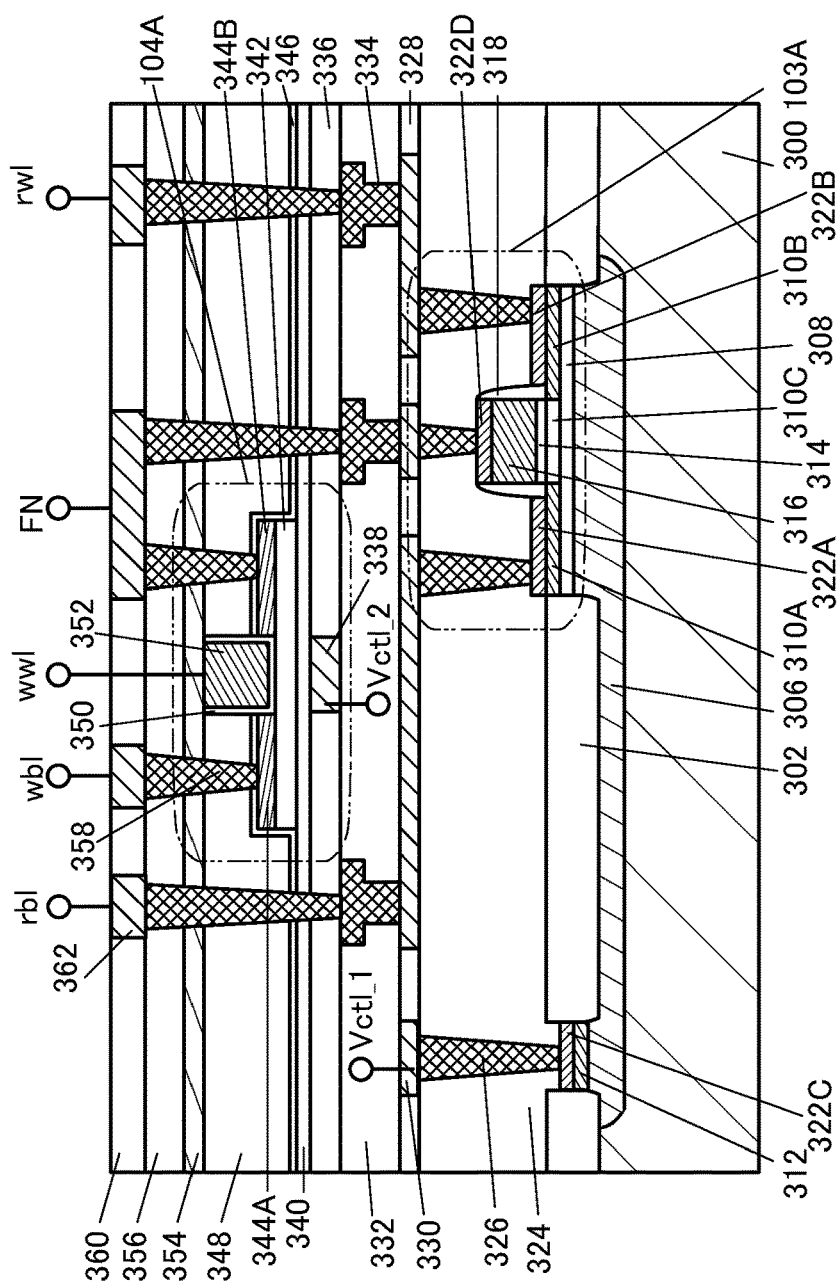
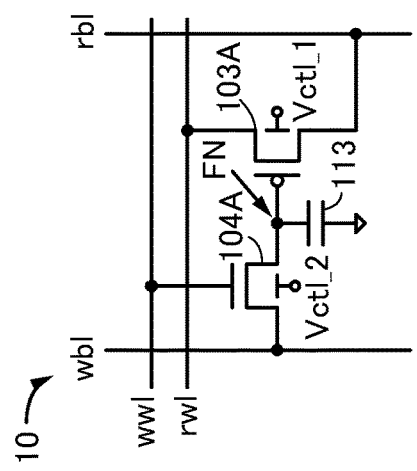
FIG. 1B
FIG. 1A

SEMICONDUCTOR DEVICE

CROSS REFERENCE TO RELATED APPLICATIONS

This application is a U.S. National Phase Application under 35 U.S.C. § 371 of International Application PCT/IB2020/060397, filed on Nov. 5, 2020, which is incorporated by reference and claims the benefit of a foreign priority application filed in Japan on Nov. 15, 2019, as Application No. 2019-206615.

TECHNICAL FIELD

In this specification, a semiconductor device and the like are described.

Note that one embodiment of the present invention is not limited to the above technical field. Examples of the technical field of one embodiment of the present invention disclosed in this specification and the like include a semiconductor device, an imaging device, a display device, a light-emitting device, a power storage device, a storage device, a display system, an electronic device, a lighting device, an input device, an input/output device, a driving method thereof, and a manufacturing method thereof.

BACKGROUND ART

As a semiconductor applicable to a transistor, a metal oxide has been attracting attention. An In—Ga—Zn oxide called "IGZO" and the like is a typical multi-component metal oxide. From researches on IGZO, a CAAC (c-axis aligned crystalline) structure and an nc (nanocrystalline) structure, which are neither single crystal nor amorphous, have been found (e.g., Non-Patent Document 1).

It has been reported that a transistor including a metal oxide semiconductor in a channel formation region (hereinafter referred to as an "oxide semiconductor transistor" or an "OS transistor" in some cases) has extremely low off-state current (e.g., Non-Patent Documents 1 and 2). A variety of semiconductor devices using OS transistors have been manufactured (e.g., Non-Patent Documents 3 and 4).

A memory utilizing extremely low off-state current of an OS transistor (also referred to as an OS memory in some cases) is proposed. For example, a circuit configuration of a NOSRAM is disclosed in Patent Document 1. Note that "NOSRAM (registered trademark)" is an abbreviation for "Nonvolatile Oxide Semiconductor RAM". A NOSRAM is a memory in which its memory cell is a 2-transistor (2T) or 3-transistor (3T) gain cell, and its access transistor is an OS transistor. An OS transistor has extremely low current that flows between a source and a drain in an off state, that is, leakage current. The NOSRAM can be used as a nonvolatile memory by retaining electric charge corresponding to data in the memory circuit, using characteristics of extremely low leakage current.

REFERENCE

Patent Document

[Patent Document 1] United States Patent Application Publication No. 2011/0176348

Non-Patent Document

[Non-Patent Document 1] S. Yamazaki et al., "Properties of crystalline In—Ga—Zn-oxide semiconductor and its transistor characteristics", Jpn. J. Appl. Phys., vol. 53, 04ED18 (2014).

[Non-Patent Document 2] K. Kato et al., "Evaluation of Off-State Current Characteristics of Transistor Using Oxide Semiconductor Material, Indium-Gallium-Zinc Oxide", Jpn. J. Appl. Phys., vol. 51, 021201 (2012).

[Non-Patent Document 4] T. Ishizu et al., "Embedded Oxide Semiconductor Memories: A Key Enabler for Low-Power ULSI", ECS Tran., vol. 79, pp. 149-156 (2017).

SUMMARY OF THE INVENTION

Problems to be Solved by the Invention

Data in a NOSRAM is read out by applying a potential retained in an off state of an OS transistor to a gate of a transistor including silicon in its channel formation region (a Si transistor). In a NOSRAM, a reduction in voltages of signals supplied to wirings is effective in reducing power consumed for data reading. However, since variations in the threshold voltages of the Si transistors increase in accordance with miniaturization of the transistors, it is difficult to reduce the voltages of signals supplied to wirings.

An Si transistor has much higher current flowing when the being in an on state (on-state current) than an OS transistor. However, in the case where intermittent operation is performed like a peripheral circuit for driving an OS memory, there is a possibility that current flowing when a Si transistor is off (leakage current) is increased or standby power is increased with a higher degree of integration of transistors.

An object of one embodiment of the present invention is to provide a semiconductor device excellent in reducing power consumption. Another object of one embodiment of the present invention is to provide a semiconductor device which has reduced leakage current and is excellent in reducing standby power. Another object is to provide a semiconductor device with a novel structure.

One embodiment of the present invention does not necessarily achieve all the above objects and only needs to achieve at least one of the objects. The descriptions of the above objects do not preclude the existence of other objects. Objects other than these objects will be apparent from the descriptions of the specification, the claims, the drawings, and the like, and objects other than these objects can be derived from the descriptions of the specification, the claims, the drawings, and the like.

Means for Solving the Problems

One embodiment of the present invention is a semiconductor device including a memory circuit including a first transistor and a second transistor. The first transistor is formed on a silicon substrate. The second transistor is formed in a layer above a layer where the first transistor is provided. The first transistor includes a first gate electrode and a first back gate electrode with a first channel formation region interposed therebetween. The first gate electrode is electrically connected to one of a source and a drain of the second transistor. The first back gate electrode is formed using a region where an impurity element imparting a conductivity type is selectively introduced in the silicon substrate.

One embodiment of the present invention is a semiconductor device including a memory circuit including a first transistor and a second transistor, and a peripheral circuit of the memory circuit. The peripheral circuit includes a third transistor and a fourth transistor. The first transistor, the third transistor, and the fourth transistor are each provided on a silicon substrate. The second transistor is provided in a layer above a layer where the first transistor, the third transistor, and the fourth transistor are provided. The first transistor includes a first gate electrode and a first back gate electrode with a first channel formation region interposed therebetween. The first gate electrode is electrically connected to one of a source and a drain of the second transistor. The first back gate electrode is formed using a region where an impurity element imparting a conductivity type is selectively introduced in the silicon substrate.

In one embodiment of the present invention, it is preferable that the first transistor include an insulating layer between the first back gate electrode and the channel formation region, and that the insulating layer be an insulating layer formed as a buried oxide.

In the semiconductor device of one embodiment of the present invention, the second transistor preferably includes a second channel formation region, and the second channel formation region preferably includes a metal oxide.

In the semiconductor device of one embodiment of the present invention, the metal oxide preferably contains In, Ga, and Zn.

In the semiconductor device of one embodiment of the present invention, the second transistor preferably includes a second back gate electrode.

In the semiconductor device of one embodiment of the present invention, it is preferable that the third transistor include a third gate electrode and a third back gate electrode with a third channel formation region interposed therebetween, the fourth transistor include a fourth gate electrode and a fourth back gate electrode with a fourth channel formation region interposed therebetween, the third back gate electrode be formed using a region where a first impurity element imparting an n-type conductivity is selectively introduced in the silicon substrate, and the fourth back gate electrode be formed using a region where a second impurity element imparting a p-type conductivity is selectively introduced in the silicon substrate.

Note that other embodiments of the present invention will be shown in the description of the following embodiments and the drawings.

Effect of the Invention

One embodiment of the present invention can provide a semiconductor device excellent in reducing power consumption. Another embodiment of the present invention can provide a semiconductor device which has reduced leakage current and is excellent in reducing standby power. Another embodiment of the present invention can provide a semiconductor device with a novel structure.

The description of a plurality of effects does not disturb the existence of other effects. In addition, one embodiment of the present invention does not necessarily achieve all the effects described as examples. In one embodiment of the present invention, other objects, effects, and novel features are apparent from the description of this specification and the drawings.

BRIEF DESCRIPTION OF THE DRAWINGS

FIG. 1A and FIG. 1B are diagrams each illustrating a structure example of a semiconductor device.

MODE FOR CARRYING OUT THE INVENTION

Figure 2A:
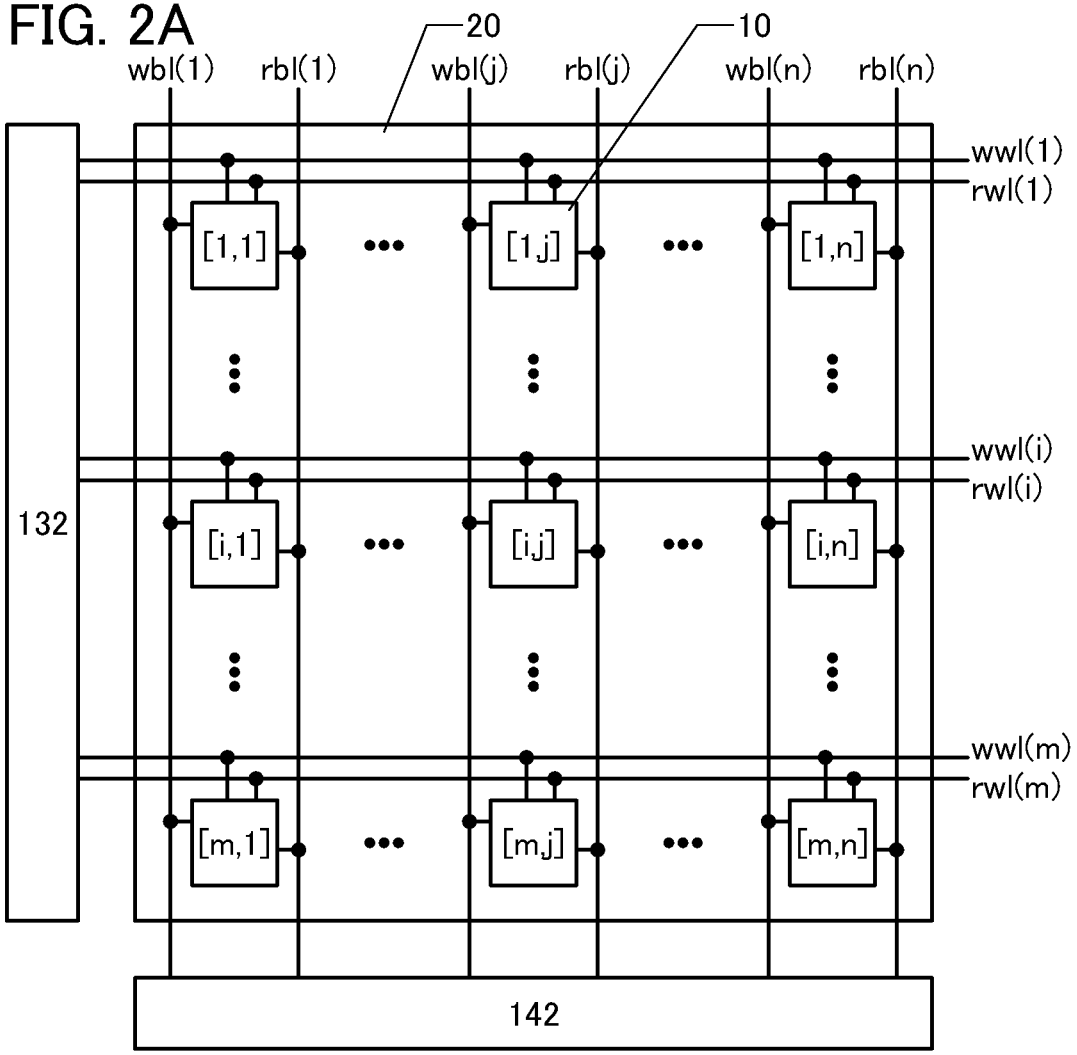
FIG. 2A to FIG. 2C are diagrams illustrating configuration examples of a semiconductor device.

Embodiments of the present invention will be described below. Note that one embodiment of the present invention is not limited to the following description, and it will be readily understood by those skilled in the art that modes and details of the present invention can be modified in various ways without departing from the spirit and scope of the present invention. One embodiment of the present invention therefore should not be construed as being limited to the following description of the embodiments.

Note that ordinal numbers such as "first", "second", and "third" in this specification and the like are used in order to avoid confusion among components. Thus, the terms do not limit the number of components. Furthermore, the ordinal numbers do not limit the order of components. In this specification and the like, for example, a "first" component in one embodiment can be referred to as a "second" component in other embodiments or claims. Furthermore, in this specification and the like, for example, a "first" component in one embodiment can be omitted in other embodiments or claims.

The same components, components having similar functions, components made of the same material, components formed at the same time, and the like in the drawings are denoted by the same reference numerals, and repeated description thereof is skipped in some cases.

In this specification, for example, a power supply potential VDD may be abbreviated to a potential VDD, VDD, or the like. The same applies to other components (e.g., a signal, a voltage, a circuit, an element, an electrode, and a wiring).

In the case where a plurality of components are denoted by the same reference numerals, and, particularly when they need to be distinguished from each other, an identification sign such as "_1", "_2", "[n]", or "[m,n]" is sometimes added to the reference numerals. For example, a second wiring GL is referred to as a wiring GL[2].

Embodiment 1

A configuration of a semiconductor device of one embodiment of the present invention or the like is described.

In this specification and the like, a semiconductor device generally means a device that can function by utilizing semiconductor characteristics. A semiconductor element such as a transistor, a semiconductor circuit, a logic circuit, an arithmetic device, and a storage device are each an embodiment of a semiconductor device. It can be sometimes said that a display device (a liquid crystal display device, a light-emitting display device, and the like), a projection device, a lighting device, an electro-optical device, a power storage device, a storage device, a semiconductor circuit, an imaging device, an electronic device, and the like include a semiconductor device.

FIG. 1A is a diagram illustrating a semiconductor device 10 of one embodiment of the present invention.

The semiconductor device 10 illustrated in FIG. 1A has a function of a memory circuit configured to retain data. The semiconductor device 10 includes at least a transistor 103A and a transistor 104A each including a gate electrode and a back gate electrode. The transistor 103A is illustrated as a p-channel transistor and the transistor 104A is illustrated as an n-channel transistor.

In addition to the transistor 103A and the transistor 104A, FIG. 1A also illustrates a capacitor 113 for retaining a gate potential (a node FN) of the transistor 103A. FIG. 1A also illustrates a wiring wwl that controls on/off of the transistor 104A functioning as a switch. FIG. 1A also illustrates a wiring wbl for writing a potential corresponding to data into the node FN. As the potential corresponding to data, binary, ternary, or more multilevel data can be used.

FIG. 1A also illustrates a wiring rbl for reading the potential corresponding to data. FIG. 1A also illustrates a wiring rwl for reading the potential corresponding to data to the wiring rbl. For example, the wiring rwl is set at an H level in a data reading period. Current corresponding to a potential of the node FN and a threshold voltage of the transistor 104A flows through the transistor 104A. The potential of the wiring rbl changes in accordance with the current, and the potential of the wiring rbl can be output to a peripheral circuit.

Data writing in the semiconductor device 10 illustrated in FIG. 1A is performed in such a manner that a high-level potential is applied to the wiring wwl to bring the transistor 104A into a conduction state, and thus the node FN and the wiring wbl are electrically connected. Specifically, when the transistor 104A is in a conduction state, a potential corresponding to data written to the wiring wbl is applied, and thus the potential is written to the node FN. After that, a low-level potential is applied to the wiring wwl to bring the transistor 104A into a non-conduction state, whereby the potential of the node FN is retained.

Data reading is performed in such a manner that a predetermined potential is applied to the wiring rbl, and after that, the wiring rbl is brought into an electrically floating state, and a high-level potential is applied to the wiring rwl. Hereinafter, applying a predetermined potential to the wiring rbl and then making the wiring rbl into a floating state are expressed as precharging the wiring rbl.

For example, by precharging the wiring rbl with the potential Vss, the transistor 103A has a potential difference between the source and the drain, and current flowing between the source and the drain of the transistor 103A is determined depending on a potential retained at the node FN. Thus, the potential retained at the node FN can be read by reading a change in potential of the wiring rbl at the time when the wiring rbl is in a floating state.

A row where the semiconductor devices 10 to which data is to be written are placed is selected by applying a high-level potential to the wiring wwl, and a row where the semiconductor devices 10 from which data is to be read are placed is selected by applying a high-level potential to the wiring rwl. In contrast, a row where the semiconductor devices 10 to which data is not written are placed can be in a non-selected state by applying a low-level potential to the wiring wwl, and a row where the semiconductor devices 10 from which data is not read are placed can be in a non-selected state by applying, to the wiring rwl, the same potential as a potential precharged to the wiring rbl.

In one embodiment of the present invention, a transistor which forms the semiconductor device 10 includes a back gate electrode for controlling a threshold voltage, in addition to a gate electrode.

The transistor 103A includes the gate electrode and the back gate electrode. The transistor 104A includes the gate electrode and the back gate electrode. The threshold voltage of each of the transistors is controlled by the level of the potential of the back gate electrode, more specifically, a potential difference between the source and the back gate electrode.

A semiconductor layer included in the transistor 103A is silicon. That is, the transistor 103A is a Si transistor. The transistor 103A is a fully-depleted silicon on insulator (FD-SOI) transistor that is formed using an SOI (Silicon On Insulator) substrate including an insulating layer formed as a buried oxide in a silicon substrate (also referred to as a BOX (Buried oxide) layer) and a thin-film single crystal silicon over the insulating layer. As the SOI substrate, an SOI substrate formed by a SIMOX (Separated by Implanted Oxygen) method or a Smart Cut method can be used. An n-channel transistor or a p-channel transistor can be employed as the transistor 103A depending on an impurity element added to an impurity region.

A region (a well region) in which an impurity element imparting conductivity is added can be provided over the silicon substrate where the transistor 103A is provided. The well region can serve as a back gate electrode by independently changing the potential of the well region. Accordingly, the threshold voltage of the Si transistor can be controlled. In particular, in the case where the Si transistor is a p-channel transistor, when a positive potential is applied to the well region, the threshold voltage of the Si transistor can be further increased, and the off-state current can be reduced. Therefore, a positive potential is applied to the well region, so that drain current when a potential applied to a gate electrode of the Si transistor is 0 V can be reduced. Furthermore, addition of the impurity element to the channel formation region for the purpose of controlling the threshold voltage is not necessary, a variation in threshold voltages can be reduced, and the power supply voltage and the amplitude voltage of a signal to each wiring can be lowered.

A semiconductor layer included in the transistor 104A is an oxide semiconductor (a metal oxide). That is, the transistor 104A is an OS transistor.

A metal oxide has a band gap of 2.5 eV or wider; thus, an OS transistor has an extremely low off-state current. For example, the off-state current per micrometer in channel width at a source-drain voltage of 3.5 V and room temperature (25° C.) can be lower than $1 \times 10^{-20}$ A, lower than $1 \times 10^{-22}$ A, or lower than $1 \times 10^{-24}$ A. That is, the on/off ratio of drain current can be greater than or equal to 20 digits and less than or equal to 150 digits.

A highly integrated semiconductor device generates heat due to circuit drive in some cases. This heat makes the temperature of a transistor rise to change the characteristics of the transistor, and the field-effect mobility thereof might change or the operation frequency thereof might decrease, for example. Since an OS transistor has a higher heat resistance than a Si transistor, the field-effect mobility is less likely to change and the operation frequency is less likely to decrease due to a temperature change. Even when the temperature becomes high, an OS transistor is likely to keep a property of the drain current increasing exponentially with respect to a gate-source voltage. Thus, the use of an OS transistor enables stable operation in a high-temperature environment.

In the semiconductor device 10, the transistor 104A included as an OS transistor can be stacked over a Si transistor; thus, an n-channel transistor and a p-channel transistor can be disposed without an increase in circuit area. In one embodiment of the present invention, a p-channel Si transistor is provided over a well region functioning as a back gate; thus, the threshold voltage can be controlled and the power supply voltage and the amplitude voltages of signals to wirings can be switched. Consequently, the standby power of the semiconductor device can be reduced.

When the transistor 103A is a p-channel transistor, the absolute value of the threshold voltage of the transistor 103A tends to be larger as a potential Vctl_1 applied to the back gate electrode becomes higher. In contrast, the absolute value of the threshold voltage of the transistor 103A tends to be smaller as the potential Vctl_1 applied to the back gate electrode becomes lower. Accordingly, in one embodiment of the present invention, depending on the conductivity type of a transistor, the potential Vctl_1 is switched in accordance with the operating state, whereby the standby power can be reduced.

When the transistor 103A is an n-channel transistor, the absolute value of the threshold voltage of the transistor 103A tends to be larger as the potential Vctl_1 applied to the back gate electrode becomes lower. In contrast, the absolute value of the threshold voltage of the transistor 103A tends to be smaller as the potential Vctl_1 applied to the back gate electrode becomes higher. Accordingly, in one embodiment of the present invention, depending on the conductivity type of a transistor, the potential Vctl_1 is switched in accordance with the operating state, whereby the standby power can be reduced.

When the transistor 104A is an n-channel transistor, the absolute value of the threshold voltage of the transistor 104A tends to be larger as a potential Vctl_2 applied to the back gate electrode becomes lower. In contrast, the absolute value of the threshold voltage of the transistor 104A tends to be smaller as the potential Vctl_2 applied to the back gate electrode becomes higher. Accordingly, in one embodiment of the present invention, the potential Vctl_2 is switched in accordance with the operating state, whereby the standby power is reduced.

Next, the structures of the transistor 103A and the transistor 104A which are used in the semiconductor device 10 are described. FIG. 1B illustrates an example of a cross-sectional structure of the transistor 103A and the transistor 104A.

In FIG. 1B, the transistor 103A and the transistor 104A are formed over a silicon substrate 300. The transistor 103A is a transistor in which a well region functioning as a back gate electrode is provided in a fully-depleted silicon on insulator (FD-SOI).

An insulating layer 302 and a well region 306 are formed over the silicon substrate 300.

The silicon substrate 300 is preferably a substrate formed using p-type or n-type single crystal silicon.

The insulating layer 302 functions as an element isolation layer. The element isolation layer can be formed in such a manner that an opening reaching the silicon substrate 300 is formed and then the opening is filled with a single layer or a stacked layer of silicon oxide and silicon nitride. The insulating layer other than the opening is selectively removed by a CMP (Chemical Mechanical Polishing) method or the like, whereby the island-shaped insulating layer 302 can be formed.

The well region 306, which is a region where an element imparting a conductivity type is selectively introduced in the silicon substrate, functions as a back gate electrode. An n-type impurity, such as phosphorus (P) or arsenic (As), or an impurity imparting p-type conductivity, such as boron (B), is added to the silicon substrate 300 by ion implantation, whereby the well region 306 with n-type or p-type conductivity can be formed.

Impurity regions 310A and 310B and a channel formation region 310C, which are a semiconductor layer, are provided over the well region 306 with an insulating layer 308, which is a BOX layer, interposed therebetween. An impurity region 312 and a conductive layer 322C for applying the potential Vctl_1 to the well region 306 are formed over the well region 306. An insulating layer 314, a conductive layer 316, and a conductive layer 322D are formed over the channel formation region 310C. The conductive layer 316 and the conductive layer 322D function as a gate electrode to which a potential Vin1 is applied. The insulating layer 314 functions as a gate insulating film. An insulating layer 318, a conductive layer 322A, and a conductive layer 322B are formed over the impurity regions 310A and 310B.

The insulating layer 308 is, for example, a silicon oxide layer with a thickness of 10 nm to 50 nm. The insulating layer 308 is an insulating layer formed as a buried oxide.

The semiconductor layer where the impurity regions 310A and 310B and the channel formation region 310C are provided is single crystal silicon provided by a SIMOX (Separated by Implanted Oxygen) method, a Smart Cut method, or the like. An n-type impurity, such as phosphorus (P) or arsenic (As), or an impurity imparting p-type conductivity, such as boron (B), is added to the impurity regions 310A, 310B, and 312 by ion implantation, whereby the impurity regions 310A, 310B, and 312 with n-type or p-type conductivity can be formed. An impurity is not introduced into a semiconductor layer directly under the insulating layer 314 and the conductive layer 316, and the semiconductor layer becomes the channel formation region 310C.

The insulating layer 314 functions as a gate insulating film. The insulating layer 314 is, for example, a silicon oxide layer with a thickness of 1 nm to 10 nm. The conductive layer 316 and the conductive layer 322D function as a gate electrode of the transistor 103A to which the potential Vin1 is applied. The conductive layer 316 is polycrystalline silicon with a thickness of, for example, 40 nm to 200 nm.

The insulating layer 318 functions as a sidewall insulating layer (a sidewall spacer). The insulating layer 318 can be formed in such a manner that an insulating film to be the insulating layer 318 is formed, and then anisotropic dry etching or the like is performed on the insulating film. For the insulating layer 318, silicon oxide, silicon nitride, or a stacked layer of silicon oxide and silicon nitride can be used, for example.

The conductive layers 322A to 322D are metal silicide layers of, for example, cobalt silicide, nickel silicide, nickel platinum silicide, or the like. The conductive layers 322A to 322D can increase the conductivity of terminals of the transistor 103A, such as the source, the drain, and the gate.

An insulating layer 324 functioning as an interlayer insulating film and a conductive layer 326 functioning as an electrode for applying the potential Vctl_1 to the transistor 103A and the well region are formed over the transistor 103A. An insulating layer 328, a conductive layer 330, an insulating layer 332, and a conductive layer 334 are provided over the insulating layer 324 and the conductive layer 326. An insulating layer 336 and a conductive layer 338 are formed over the insulating layer 332 and the conductive layer 334. The conductive layer 338 functions as a back gate electrode of an n-channel transistor to which the potential Vctl_2 is applied.

For the insulating layer 324, the insulating layer 328, the insulating layer 332, and the insulating layer 336, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that contains oxygen at a higher proportion than nitrogen in its composition, and silicon nitride oxide refers to a material that contains nitrogen at a higher proportion than oxygen in its composition. Furthermore, in this specification, aluminum oxynitride refers to a material that contains oxygen at a higher proportion than nitrogen in its composition, and aluminum nitride oxide refers to a material that contains nitrogen at a higher proportion than oxygen in its composition.

In addition, for the insulating layer 332, it is preferable to use a film having a barrier property that prevents diffusion of hydrogen or impurities from the silicon substrate 300, the transistor 103A, or the like into a region where the transistor 104A is provided.

For the film having a barrier property against hydrogen, silicon nitride formed by a CVD method can be used, for example. Here, diffusion of hydrogen into a semiconductor element including an oxide semiconductor, such as the transistor 104A, degrades the characteristics of the semiconductor element in some cases. Therefore, a film that inhibits hydrogen diffusion is preferably provided between the transistor 103A and the transistor 104A. The film that inhibits hydrogen diffusion is specifically a film from which a small amount of hydrogen is released.

As a material for each of the conductive layer 326, the conductive layer 330, the conductive layer 334, and the conductive layer 338, a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

An insulating layer 340 is provided over the insulating layer 336 and the conductive layer 338. A semiconductor layer 342 and conductive layers 344A and 344B are provided over the insulating layer 340. An insulating layer 346 and an insulating layer 348 are provided over the semiconductor layer 342 and the conductive layers 344A and 344B. The conductive layers 344A and 344B function as a source electrode and a drain electrode of the transistor 104A.

As the insulating layer 340, an insulator that contains oxygen more than oxygen in the stoichiometric composition is preferably used. Such oxygen is easily released from the insulator by heating. In this specification and the like, oxygen released by heating is sometimes referred to as excess oxygen. That is, a region containing excess oxygen (also referred to as an "excess-oxygen region") is preferably formed in the insulating layer 340. When such an insulator containing excess oxygen is provided in contact with the semiconductor layer 342, oxygen vacancies ($V_O$) in the semiconductor layer 342 can be reduced and the reliability of the transistor 104A can be improved. When hydrogen enters the oxygen vacancies in the semiconductor layer 342, such defects (hereinafter, referred to as $V_OH$ in some cases) serve as donors and generate electrons serving as carriers in some cases. In other cases, bonding of part of hydrogen to oxygen bonded to a metal atom generates electrons serving as carriers. Thus, a transistor including an oxide semiconductor that contains a large amount of hydrogen is likely to have normally-on characteristics. Moreover, hydrogen in an oxide semiconductor is easily transferred by a stress such as heat or an electric field; thus, a large amount of hydrogen contained in an oxide semiconductor might reduce the reliability of the transistor. In one embodiment of the present invention, $V_OH$ in the semiconductor layer 342 is preferably reduced as much as possible so that the semiconductor layer 342 becomes a highly purified intrinsic or substantially highly purified intrinsic oxide. It is important to remove impurities such as moisture and hydrogen in an oxide semiconductor (sometimes described as "dehydration" or "dehydrogenation treatment") and to compensate for oxygen vacancies by supplying oxygen to the oxide semiconductor (sometimes described as "oxygen adding treatment") in order to obtain an oxide semiconductor whose $V_OH$ is sufficiently reduced. When an oxide semiconductor with sufficiently reduced impurities such as $V_OH$ is used for a channel formation region of a transistor, stable electrical characteristics can be given.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0\times10^{18}$ atoms/cm$^3$, preferably greater than or equal to $1.0\times10^{19}$ atoms/cm$^3$, further preferably greater than or equal to $2.0\times10^{19}$ atoms/cm$^3$ or greater than or equal to $3.0\times10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the semiconductor layer 342 are in contact with each other. By the treatment, water or hydrogen in the semiconductor layer 342 can be removed. For example, in the semiconductor layer 342, dehydrogenation can be performed when a reaction in which a bond of $V_OH$ is cut occurs, i.e., a reaction of "$V_OH \rightarrow V_O+H$" occurs. Part of hydrogen generated at this time is bonded to oxygen to be $H_2O$, and removed from the semiconductor layer 342 or an insulator in the vicinity of the semiconductor layer 342 in some cases. Some hydrogen are gettered into the conductive layers 344A and 344B in some cases.

For the microwave treatment, for example, an apparatus including a power source that generates high-density plasma or an apparatus including a power source that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the semiconductor layer 342 or an insulator in the vicinity of the semiconductor layer 342. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ratio ($O_2/(O_2+Ar)$) is lower than or equal to 50%, preferably higher than or equal to 10% and lower than or equal to 30%.

The semiconductor layer 342 has a stacked-layer structure of two, three, or more layers of oxides having different atomic ratios of metal atoms, leading to a highly reliable semiconductor device. The metal oxide functioning as an oxide semiconductor may be formed by a sputtering method or an ALD (Atomic Layer Deposition) method.

A metal oxide used for an OS transistor is Zn oxide, Zn—Sn oxide, Ga—Sn oxide, In—Ga oxide, In—Zn oxide, In-M-Zn oxide (M is one or more metals selected from Ti, Ga, Y, Zr, La, Ce, Nd, Sn, and Hf), or the like. The use of a metal oxide containing Ga as M for the OS transistor is particularly preferable because the electrical characteristics such as field-effect mobility of the transistor can be made excellent by adjusting a ratio of elements. In addition, an oxide containing indium and zinc may contain one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like.

In order to improve the reliability and electrical characteristics of the OS transistor, it is preferable that the metal oxide used in the semiconductor layer is a metal oxide having a crystal portion such as CAAC-OS, CAC-OS, or nc-OS. CAAC-OS is an abbreviation for c-axis-aligned crystalline oxide semiconductor. CAC-OS is an abbreviation for Cloud-Aligned Composite oxide semiconductor. In addition, nc-OS is an abbreviation for nanocrystalline oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The CAC-OS has a function of allowing electrons (or holes) serving as carriers to flow and a function of not allowing electrons serving as carriers to flow. The function of allowing electrons to flow and the function of not allowing electrons to flow are separated, whereby both functions can be heightened to the maximum. In other words, when CAC-OS is used for a channel formation region of an OS transistor, high on-state current and extremely low off-state current can be both achieved.

Avalanche breakdown or the like is less likely to occur in some cases in an OS transistor than in a general Si transistor because, for example, a metal oxide has a wide band gap and thus electrons are less likely to be excited, and the effective mass of a hole is large. Therefore, for example, it may be possible to inhibit hot-carrier degradation or the like that is caused by avalanche breakdown. Since hot-carrier degradation can be inhibited, an OS transistor can be driven with a high drain voltage.

For the conductive layers 344A and 344B, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are conductive materials that are not easily oxidized or materials that retain their conductivity even after absorbing oxygen. Furthermore, a metal nitride film of tantalum nitride or the like is preferable because it has a barrier property against hydrogen or oxygen.

The conductive layers 344A and 344B are each illustrated as a single layer, but may have a stacked-layer structure of two or more layers. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed thereover; and a three-layer structure where a molybdenum film or a molybdenum nitride film is formed, an aluminum film or a copper film is stacked over the molybdenum film or the molybdenum nitride film, and a molybdenum film or a molybdenum nitride film is formed thereover. Note that a transparent conductive material containing indium oxide, tin oxide, or zinc oxide may be used.

The insulating layer 346 is provided to cover the conductive layers 344A and 344B and the semiconductor layer 342, whereby oxidation of the conductive layers 344A and 344B is inhibited.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used for the insulating layer 346. Alternatively, silicon nitride oxide, silicon nitride, or the like can be used for the insulating layer 346.

It is particularly preferable to use an insulator containing an oxide of one or both of aluminum and hafnium, such as aluminum oxide, hafnium oxide, or an oxide containing aluminum and hafnium (hafnium aluminate), as the insulating layer 346. In particular, hafnium aluminate has higher heat resistance than a hafnium oxide film. Therefore, hafnium aluminate is preferable because it is less likely to be crystallized by heat treatment in a later step.

For the insulating layer 348, silicon oxide, silicon oxynitride, silicon nitride oxide, silicon nitride, aluminum oxide, aluminum oxynitride, aluminum nitride oxide, aluminum nitride, or the like is used, for example.

An opening is provided in the insulating layer 346 and the insulating layer 348 to expose part of the semiconductor layer 342, and an insulating layer 350 and a conductive layer 352 are provided in the opening. The insulator 350 functions as a gate insulating film of the transistor 104A. The conductive layer 352 functions as the gate electrode of the transistor 104A.

Like the insulating layer 340, the insulating layer 350 is preferably formed using an insulator that contains excess oxygen and releases oxygen by heating.

To efficiently supply excess oxygen in the insulating layer 350 to the semiconductor layer 342, a metal oxide may be provided between the insulating layer 350 and the conductive layer 352. Providing the metal oxide inhibits diffusion of excess oxygen from the insulating layer 350 to the conductive layer 352. That is, a reduction in the amount of excess oxygen that is supplied to the semiconductor layer 342 can be inhibited.

Note that the insulating layer 350 may have a stacked-layer structure. As miniaturization and high integration of transistors progress, a problem such as leakage current might arise because of a thinner gate insulating film. For that reason, when the insulator functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high dielectric constant.

The conductive layer 352 functioning as a gate electrode may have a single layer structure or a stacked-layer structure of two or more layers.

In addition, a conductive material containing tungsten, copper, or aluminum as its main component is preferably used for the conductive layer 352. Furthermore, the conductive layer 352 also functions as a wiring and thus a conductor having high conductivity is preferably used as the conductive layer 352. For example, a conductive material containing tungsten, copper, or aluminum as its main component can be used. The conductive layer 352 may have a stacked-layer structure; for example, a stacked-layer structure with a conductive material having a function of inhibiting impurity diffusion, such as tantalum, tantalum nitride, ruthenium, or ruthenium oxide, may be employed.

An insulating layer 354 and an insulating layer 356 are provided over the transistor 104A. The insulating layer 336, the insulating layer 340, the insulating layer 346, the insulating layer 348, the insulating layer 354, and the insulating layer 356 are provided with a conductive layer 358. The conductive layer 358 functions as an electrode of the node (FN) or an electrode for supplying a signal to the wiring (rbl, wbl, or rwl) of the semiconductor device 10. An insulating layer 360 and a conductive layer 362 are provided over the insulating layer 356 and the conductive layer 358.

A substance having a barrier property against oxygen or hydrogen is preferably used for the insulating layer 354. For the insulating layer 354, a metal oxide such as aluminum oxide, hafnium oxide, or tantalum oxide can be used, for example.

When a material with a relatively low permittivity is used for the insulating layer 356, parasitic capacitance generated between wirings can be reduced. A silicon oxide film, a silicon oxynitride film, or the like can be used for the insulating layer 356, for example.

The conductive layer 358 can be formed using a material similar to that for the conductive layer 326 and the like. The conductive layer 362 can be formed using a material similar to that for the conductive layer 330 and the like. The conductive layer 362 is electrically connected to the node (FN) or the electrode for supplying a signal to the wiring (rbl, wbl, or rwl) of the semiconductor device 10.

One embodiment of the present invention can provide a semiconductor device excellent in reducing power consumption, as described above. Another embodiment of the present invention can provide a semiconductor device which has reduced leakage current and is excellent in reducing standby power. Another embodiment of the present invention can provide a semiconductor device with a novel structure.

FIG. 2A is a block diagram illustrating a configuration example of a memory cell array including a memory circuit which is illustrated as the semiconductor device 10 in FIG. 1A. The memory cell array 20 includes m×n semiconductor devices 10 in total; m semiconductor devices 10 (m is an integer greater than or equal to 2) in a column and n semiconductor devices 10 (n is an integer greater than or equal to 2) in a row. The semiconductor devices 10 are arranged in a matrix.

In FIG. 2A, [1, 1], [i, 1], [m, 1], [1, j], [i, j], [m, j], [1, n], [i, n], and [m, n] (i is an integer greater than or equal to 1 and less than or equal to m, and j is an integer greater than or equal to 1 and less than or equal to n) are the addresses of the semiconductor devices 10. The semiconductor device 10 represented by [i, j] is the semiconductor device 10 in the i-th row and the j-th column, for example.

The memory cell array 20 includes n wirings wbl (wbl(1) to wbl(n)) functioning as write bit lines, n wirings rbl (rbl(1) to rbl(n)) functioning as read bit lines, m wirings wwl (wwl(1) to wwl(m)) functioning as write word lines, and m wirings rwl (rwl(1) to rwl(m)) functioning as read word lines.

Each of the semiconductor devices 10 is electrically connected to the wiring wbl, the wiring rbl, the wiring wwl, and the wiring rwl. For example, the semiconductor device 10 whose address is [i, j] is electrically connected to a word line driver circuit 132 through a wiring wwl(i) and a wiring rwl(i) and is electrically connected to a bit line driver circuit 142 through a wiring wbl(j) and a wiring rbl(j).

Figure 2B:
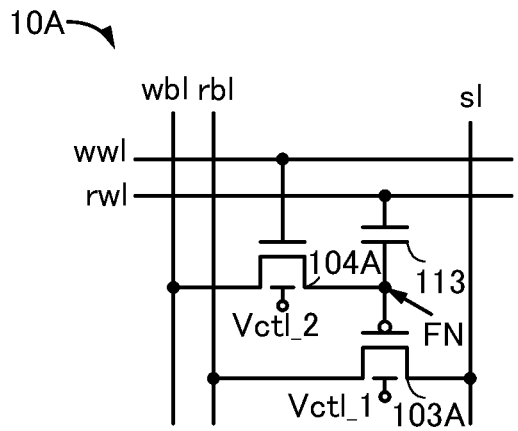

FIG. 2B is a circuit diagram illustrating a configuration example that can be used for the semiconductor device 10 illustrated in FIG. 1A.

A semiconductor device 10A includes the transistor 103A, the transistor 104A, and the capacitor 113. One of the source and the drain of the transistor 104A is electrically connected to the gate of the transistor 103A, the other of the source and the drain of the transistor 104A is electrically connected to the wiring wbl, and the gate of the transistor 104A is electrically connected to the wiring wwl. One of the source and the drain of the transistor 103A is electrically connected to the wiring rbl, and the other of the source and the drain of the transistor 103A is electrically connected to a wiring sl to which a fixed potential is applied. Here, a connection portion where the one of the source and the drain of the transistor 104A and the gate of the transistor 103A are electrically connected is referred to as the node FN. One electrode of the capacitor 113 is electrically connected to the node FN. The other electrode of the capacitor 113 is electrically connected to the wiring rwl. The back gate electrode of the transistor 103A is supplied with the potential Vctl_1 for controlling the threshold voltage. The back gate electrode of the transistor 104A is supplied with the potential Vctl_2 for controlling the threshold voltage.

Figure 2C:
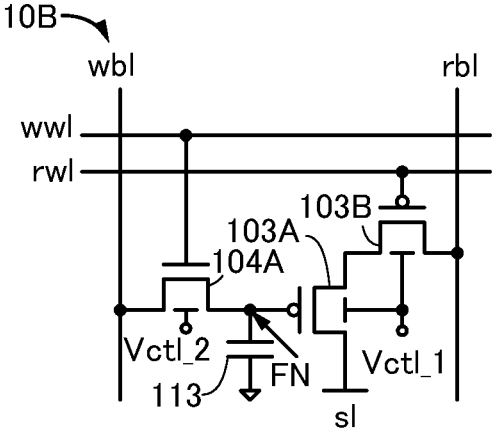

FIG. 2C is a circuit diagram illustrating a configuration example that is different from FIG. 2B and can be used for the semiconductor device 10 illustrated in FIG. 1A.

A semiconductor device 10B includes the transistor 103A, a transistor 103B, the transistor 104A, and the capacitor 113. The one of the source and the drain of the transistor 104A is electrically connected to the gate of the transistor 103A, the other of the source and the drain of the transistor 104A is electrically connected to the wiring wbl, and the gate of the transistor 104A is electrically connected to the wiring wwl. The one of the source and the drain of the transistor 103A is electrically connected to one of a source and a drain of the transistor 103B, and the other of the source and the drain of the transistor 103A is electrically connected to the wiring sl to which a fixed potential is applied. A gate of the transistor 103B is electrically connected to the wiring rwl. The other of the source and the drain of the transistor 103B is electrically connected to the wiring rbl. Here, a connection portion where the one of the source and the drain of the transistor 104A and the gate of the transistor 103A are electrically connected is referred to as the node FN. The one electrode of the capacitor 113 is electrically connected to the node FN. The other electrode of the capacitor 113 is supplied with a fixed potential. The back gate electrode of the transistor 103A and a back gate electrode of the transistor 103B are supplied with the potential Vctl_1 for controlling the threshold voltage. The back gate electrode of the transistor 104A is supplied with the potential Vctl_2 for controlling the threshold voltage.

Figure 3A:
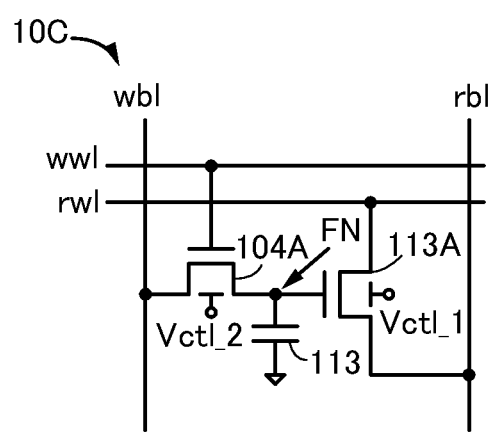
FIG. 3A to FIG. 3C are diagrams illustrating configuration examples of a semiconductor device.
Figure 3B:
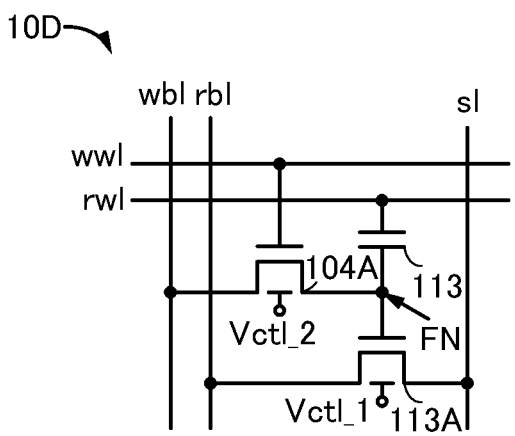
Figure 3C:
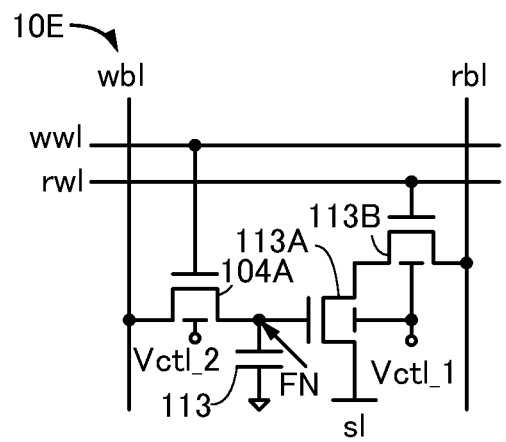

Note that in the circuit diagrams of the semiconductor devices illustrated in FIG. 1A, FIG. 2B, and FIG. 2C, p-channel transistors are illustrated as the transistors 103A and 103B, but another structure may be employed. For example, as illustrated as the semiconductor devices 10C, 10D, and 10E in FIG. 3A, FIG. 3B, and FIG. 3C, n-channel transistors can be used as the transistors 113A and 113B. Components other than the transistors 113A and 113B are the same as the components illustrated in FIG. 1A, FIG. 2B, and FIG. 2C, and thus description thereof is omitted.

Each of the semiconductor devices 10 and 10A to 10E functioning as the above-described memory circuit is a gain-cell memory cell formed of two transistors and one capacitor (2T1C) or three transistors and one capacitor (3T1C). A gain-cell memory cell can operate as a memory by amplifying accumulated electric charge by the closest transistor even when the capacitance of accumulated electric charge is small. Each of the semiconductor devices 10 and 10A to 10E is the above-described NOSRAM. A NOSRAM is capable of reading retained data without destruction (non-destructive reading), and thus is suitable for product-sum operation of a neural network in which data reading operation is repeated many times.

Figure 4:
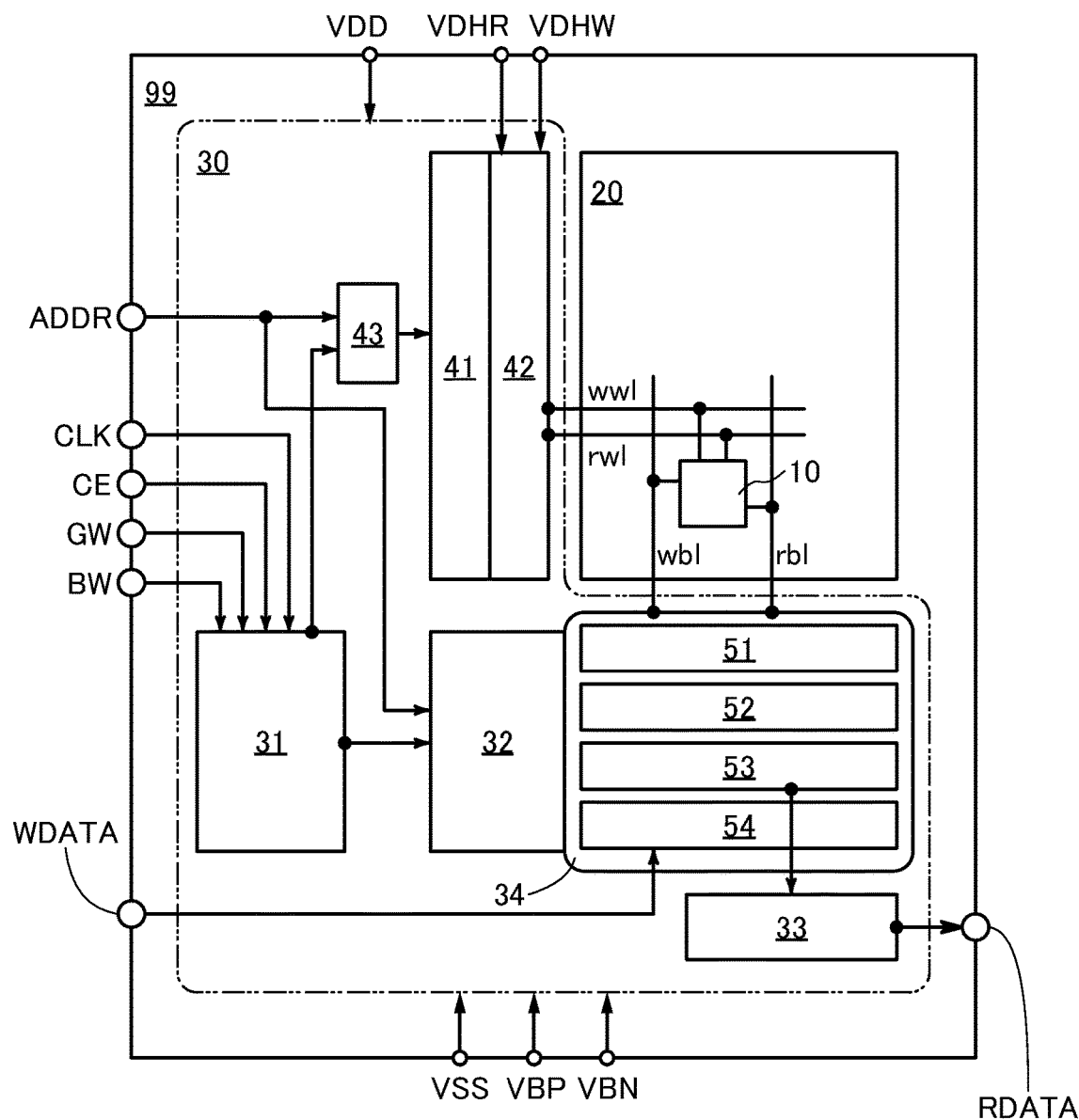
FIG. 4 is a diagram illustrating a configuration example of a semiconductor device.

FIG. 4 is a block diagram illustrating a configuration example of peripheral circuits of the memory cell array 20 including the semiconductor device 10.

A memory system 99 includes a peripheral circuit 30 and the memory cell array 20. The peripheral circuit 30 includes a row decoder 41, a word line driver circuit 42, a control logic circuit 31, a column decoder 32, an output driver 33, and a bit line driver circuit 34. The memory cell array 20 includes the semiconductor device 10, the wiring wwl, the wiring rwl, the wiring wbl, and the wiring rbl.

The potential VSS, the potential VDD, a potential VDHR, a potential VDHW, a potential VBP, and a potential VBN are input to the memory system 99. The potential VDHW is a high power supply potential of the wiring wwl. The potential VDHR is a high power supply potential of the wiring rwl. The potential VBP is a potential applied to the back gate electrode of the p-channel transistor 103A in the peripheral circuit 30. The potential VBN is a potential applied to the back gate electrode of the n-channel transistor 103A in the peripheral circuit 30. The potential VBP and the potential VBN are potentials (signals) which can be switched in accordance with an operation mode or the like.

A clock signal CLK, a chip enable signal CE, a global write enable signal GW, a byte write enable signal BW, an address signal ADDR, and a data signal WDATA are input to the memory system 99. The memory system 99 outputs a data signal RDATA. Note that these signals are digital signals represented by a high level or a low level (represented by High or Low, H or L, 1 or 0, or the like in some cases). Here, each of the byte write enable signal BW, the address signal ADDR, the data signal WDATA, and the data signal RDATA is a signal having a plurality of bits.

In this specification and the like, as for a signal having a plurality of bits, for example, in the case where the byte write enable signal BW has four bits, the signal is represented by the byte write enable signal BW[3:0]. This means that the byte write enable signal includes BW[0] to BW[3]. In the case where one bit needs to be specified, for example, the signal is represented by the byte write enable signal BW[0]. When the signal is represented by the byte write enable signal BW, it means having a given bit.

For example, the byte write enable signal BW can have four bits, and each of the data signal WDATA and the data signal RDATA can have 32 bits. In other words, the byte write enable signal BW, the data signal WDATA, and the data signal RDATA are represented by the byte write enable signal BW[3:0], a data signal WDATA[31:0], and a data signal RDATA[31:0], respectively.

Note that in the memory system 99, each of the above circuits, potentials, and signals can be appropriately selected as needed. Alternatively, another circuit, another potential, or another signal may be added.

The control logic circuit 31 processes the chip enable signal CE and the global write enable signal GW and generates control signals for the row decoder 41 and the column decoder 32. For example, in the case where the chip enable signal CE is at a high level and the global write enable signal GW is at a low level, the row decoder 41 and the column decoder 32 perform reading operation; in the case where the chip enable signal CE is at a high level and the global write enable signal GW is at a high level, the row decoder 41 and the column decoder 32 perform writing operation; and in the case where the chip enable signal CE is at a low level, the row decoder 41 and the column decoder 32 can perform standby operation regardless of whether the global write enable signal GW is at a high level or a low level. Signals processed by the control logic circuit 31 are not limited to them, and other signals may be input as necessary.

Furthermore, the control logic circuit 31 processes the byte write enable signal BW[3:0] to control writing operation. Specifically, in the case where the byte write enable signal BW[0] is at a high level, the row decoder 41 and the column decoder 32 perform writing operation of the data signal WDATA[7:0]. Similarly, in the case where the byte write enable signal BW[1] is at a high level, writing operation of the data signal WDATA[15:8] is performed; in the case where the byte write enable signal BW[2] is at a high level, writing operation of the data signal WDATA[23:16] is performed; and in the case where the byte write enable signal BW[3] is at a high level, writing operation of the data signal WDATA[31:24] is performed.

An address signal ADDR is input to the row decoder 41 and the column decoder 32 in addition to the above control signals generated by the control logic circuit 31.

The row decoder 41 decodes the address signal ADDR and generates control signals for the word line driver circuit 42. The word line driver circuit 42 has a function of driving the wiring wwl and the wiring rwl. The word line driver circuit 42 selects the wiring wwl or the wiring rwl of a row which is an access target, on the basis of a control signal of the row decoder 41. In the case where the memory cell array 20 is divided into a plurality of blocks, a predecoder 43 may be provided. The predecoder 43 has a function of decoding the address signal ADDR and determining a block to be accessed.

The column decoder 32 and the bit line driver circuit 34 have a function of writing data input by the data signal WDATA to the memory cell array 20, a function of reading data from the memory cell array 20, a function of amplifying the read data and outputting the amplified data to the output driver 33, and the like.

The output driver 33 has a function of outputting, from the memory system 99, data read from the memory cell array 20 as the data signal RDATA.

The bit line driver circuit 34 includes a precharge circuit 51, a sense amplifier circuit 52, an output MUX (multiplexer) circuit 53, and a write driver circuit 54.

Figure 5:
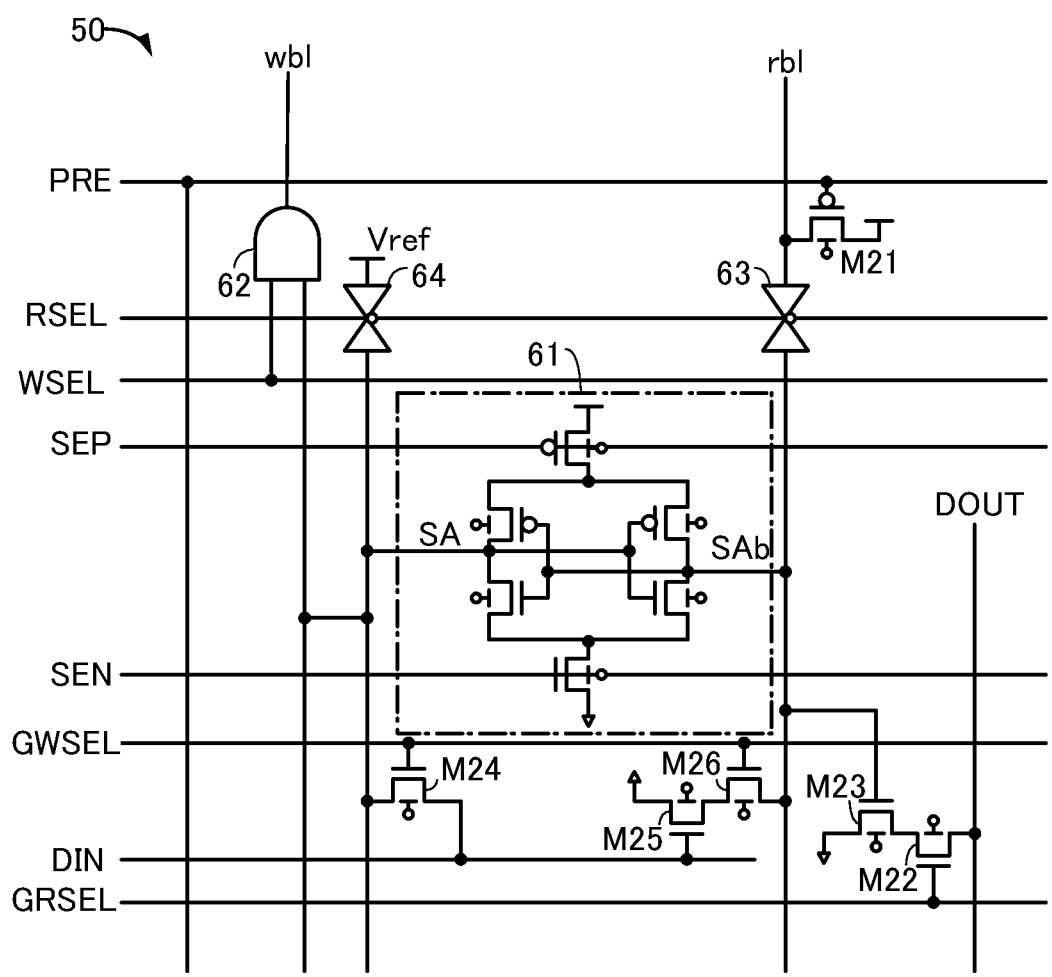
FIG. 5 is a diagram illustrating a configuration example of a semiconductor device.

FIG. 5 is a circuit diagram illustrating a configuration example of a circuit 50 applicable to the bit line driver circuit 34. Note that in this embodiment, the memory cell array 20 includes 128 semiconductor devices 10 in one row (n=128).

The circuit 50 includes a transistor M21 to a transistor M26, a sense amplifier 61, an AND circuit 62, an analog switch 63, and an analog switch 64.

The circuit 50 operates in response to a signal SEN[3:0], a signal SEP[3:0], a signal PRE, a signal RSEL[3:0], a signal WSEL, a signal GRSEL[3:0], and a signal GWSEL[15:0]. Note that a 1-bit signal of any of the 4-bit signal SEN[3:0] is input to one circuit 50. The same applies to the other signals having a plurality of bits (SEP[3:0] and the like).

The bit line driver circuit 34 writes data DIN[31:0] to the memory cell array 20 and reads data DOUT[31:0] from the memory cell array 20. One circuit 50 has a function of writing 1-bit data of any of the 32-bit data DIN[31:0] to the memory cell array 20 and reading 1-bit data of any of the 32-bit data DOUT[31:0] from the memory cell array 20. Note that the data DIN [31:0] and the data DOUT [31:0] are internal signals and correspond to the data signal WDATA and the data signal RDATA, respectively.

The transistor M21 forms the precharge circuit 51. The wiring rbl is precharged to the potential VSS by the transistor M21. The signal PRE is a precharge signal, and the conduction state of the transistor M21 is controlled by the signal PRE.

The sense amplifier 61 forms the sense amplifier circuit 52. In reading operation, the sense amplifier 61 determines whether data input to the wiring rbl is at a high level or a low level. In addition, the sense amplifier 61 functions as a latch circuit that temporarily retains the data DIN input from the write driver circuit 54 in writing operation.

The sense amplifier 61 illustrated in FIG. 5 is a latch sense amplifier. The sense amplifier 61 includes two inverter circuits, and an input node of one of the inverter circuits is connected to an output node of the other of the inverter circuits. When the input node of the one of the inverter circuits is a node SA and the output node is a node SAb, complementary data is retained at the node SA and the node SAb.

The signal SEN and the signal SEP are each a sense amplifier enable signal for activating the sense amplifier 61, and a reference potential Vref is a read judge potential. The sense amplifier 61 determines whether the potential of the node SAb at the time of the activation is at a high level or a low level on the basis of the reference potential Vref.

The AND circuit 62 controls electrical continuity between the node SA and the wiring wbl. The analog switch 63 controls electrical continuity between the node SAb and the wiring rbl, and the analog switch 64 controls electrical continuity between the node SA and a wiring for supplying the reference potential Vref.

The signal WSEL is a write selection signal, which controls the AND circuit 62. The signal RSEL is a read selection signal, which controls the analog switch 63 and the analog switch 64.

The transistor M22 and the transistor M23 form the output MUX circuit 53. The signal GRSEL[3:0] is a global read selection signal and controls the output MUX circuit 53. The output MUX circuit 53 has a function of selecting, from 128 wirings rbl, 32 wirings rbl from which data is to be read. The output MUX circuit 53 functions as a multiplexer of 128 inputs and 32 outputs. The output MUX circuit 53 reads the data DOUT [31:0] from the sense amplifier circuit 52 and outputs the data to the output driver 33.

Note that the number of wirings rbl from which the output MUX circuit 53 reads data is not limited to 32. The number may be 16 or 64, for example. A configuration where the bit line driver circuit 34 does not include the output MUX circuit 53 may also be employed. In that case, data read from 128 wirings rbl is output from the sense amplifier circuit 52 to the output driver 33. The number of wirings rbl needed for data reading by the output MUX circuit 53, or the presence or absence of the output MUX circuit 53 can be adjusted in accordance with the configuration of the output driver 33 or the like.

The transistor M24 to the transistor M26 form the write driver circuit 54. The signal GWSEL[15:0] is a global write selection signal and controls the write driver circuit 54. The write driver circuit 54 has a function of writing the data DIN[31:0] to the sense amplifier circuit 52.

The write driver circuit 54 has a function of selecting a column where the data DIN[31:0] is to be written. The write driver circuit 54 writes data in byte units, half-word units, or word units in response to the signal GWSEL[15:0].

The circuit 50 is electrically connected to a wiring supplied with the data DIN[k] (k is an integer greater than or equal to 0 and less than or equal to 31) in every four columns. In addition, the circuit 50 is electrically connected to a wiring supplied with the data DOUT[k] in every four columns.

Figure 6:
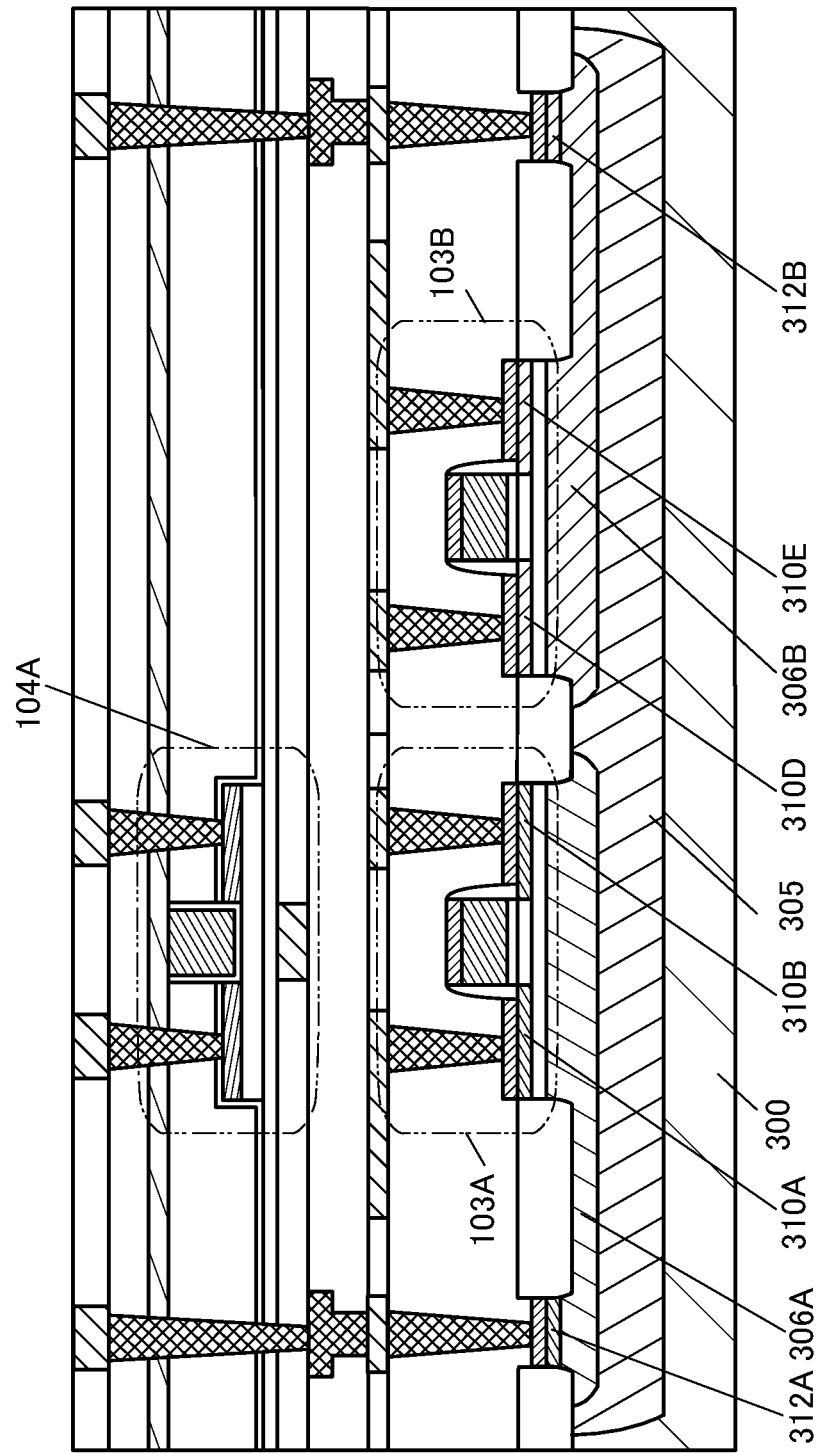
FIG. 6 is a diagram illustrating a structure example of a semiconductor device.

FIG. 6 is a diagram illustrating a cross-sectional structure of a transistor applicable to the peripheral circuit 30 illustrated in FIG. 4. The peripheral circuit 30 preferably has a configuration of a complementary logic circuit including a p-channel transistor and an n-channel transistor. This configuration can achieve lower power consumption and higher-speed operation.

As illustrated in FIG. 6, a Si transistor of one embodiment of the present invention is a transistor provided with a well region that functions as a back gate electrode in an FD-SOI (Fully-Depleted Silicon-ON-Insulator). As illustrated in FIG. 6, for example, the n-channel transistor 103A and the p-channel transistor 103B can be separately formed on the silicon substrate 300. Note that the transistor 104A, which is an OS transistor, can be provided over a layer where the transistors 103A and 103B are provided.

In the silicon substrate 300, a well region 305 containing an n-type impurity is provided in a region where the n-channel transistor 103A and the p-channel transistor 103B are provided. In the well region 305, a well region 306A to which n-type conductivity is imparted is provided in a region where the p-channel transistor 103A is provided, and a well region 306B to which p-type conductivity is imparted is provided in a region where the n-channel transistor 103B is provided. The well region 306A which faces the gate electrode of the transistor 103A with the channel formation region interposed therebetween functions as the back gate electrode of the transistor 103A. The well region 306B which faces the gate electrode of the transistor 103B with the channel formation region interposed therebetween functions as the back gate electrode of the transistor 103B.

A p-type impurity element is selectively imparted to a semiconductor layer which is provided for the p-channel transistor 103A and which is over the n-type well region 306A, whereby the impurity region 310A and the impurity region 310B are formed. An n-type impurity element is selectively imparted to a semiconductor layer which is provided for the n-channel transistor 103B and which is over the p-type well region 306B, whereby an impurity region 310D and an impurity region 310E are formed.

In a region where an insulating layer, which is a BOX layer, is removed in order to apply a potential to the well region 306A, an impurity region 312A is formed. In a region where the insulating layer, which is the BOX layer, is removed in order to apply a potential to the well region 306B, an impurity region 312B is formed.

The insulating layer, which is the BOX layer, and the semiconductor layer may be removed in the silicon substrate 300 and n-channel and p-channel transistors (bulk transistors) other than the transistors 103A and 103B may be provided on the silicon substrate 300. Alternatively, a transistor including a charge accumulation layer may be provided in the silicon substrate 300. Although a complementary transistor is illustrated as a transistor applicable to the peripheral circuit 30, the logic circuit may be formed with only n-channel transistors or only p-channel transistors. In particular, when the Si transistors are only p-channel transistors, a complementary logic circuit can be formed with n-channel OS transistors and the p-channel Si transistors, leading to simplification of a manufacturing process.

In one embodiment of the present invention, in a Si transistor, a potential applied to a back gate electrode can be switched. The potential applied to the back gate electrode can be switched in accordance with the operating state of a memory circuit.

For example, the operation of the memory circuit can be switched between four modes. One of the four modes is a high-speed mode in which the power supply voltage to the memory circuit is made high and writing and reading to/from the memory circuit are performed in a short time. Another one of the four modes is a normal mode in which writing and reading to/from the memory circuit are performed at a lower speed than in the high-speed mode. Another one of the four modes is a low-power mode in which the power supply voltage to the memory circuit is made low and writing and reading to/from the memory circuit are performed at a lower speed than in the normal mode. The other one of the four modes is a sleep mode in which the power supply voltage to the memory circuit is made extremely low to reduce leakage current in the memory circuit.

In the above four modes, changes in the potential VDD, the potential VBP, and the potential VBN and the direction of a body bias which shows magnitude relationships of potentials between the silicon substrate 300 and the Si transistor are shown collectively in Table 1. In Table 1, the high-speed mode is shown as "High-speed". In Table 1, the normal mode is shown as "Normal". In Table 1, the low-power mode is shown as "Low-power". In Table 1, the sleep mode is shown as "Sleep".

TABLE 1

|  | High-speed | Normal | Low-power | Sleep |
| --- | --- | --- | --- | --- |
| VDD | VDD1 | VDD2 | VDD3 | VDD4 |
| VBP | VBP1 | VBP2 | VBP3 | VBP4 |
| VBN | VBN1 | 0 V | VBN3 | VBN4 |
| Body bias | forward | 0 | Reverse | Reverse |

In Table 1, the potential VDD1 is higher than the potential VDD2. The potential VDD2 is higher than the potential VDD3. The potential VDD3 is higher than the potential VDD4. The potential VBP1 is higher than 0 V. The potential VDD2 is higher than the potential VBP1. The potential VBP3 is higher than the potential VDD2. The potential VBP4 is higher than the potential VBP3. The potential VBN1 is higher than 0 V. The potential VBN3 is lower than 0 V. The potential VBN4 is lower than the potential VBN3. The body bias is the forward direction, 0, or the reverse direction. The magnitude of the potential VBP1, that is, the absolute value of the potential, is equal to the level of the potential VBN1, that is, the absolute value of the potential.

Figure 7:
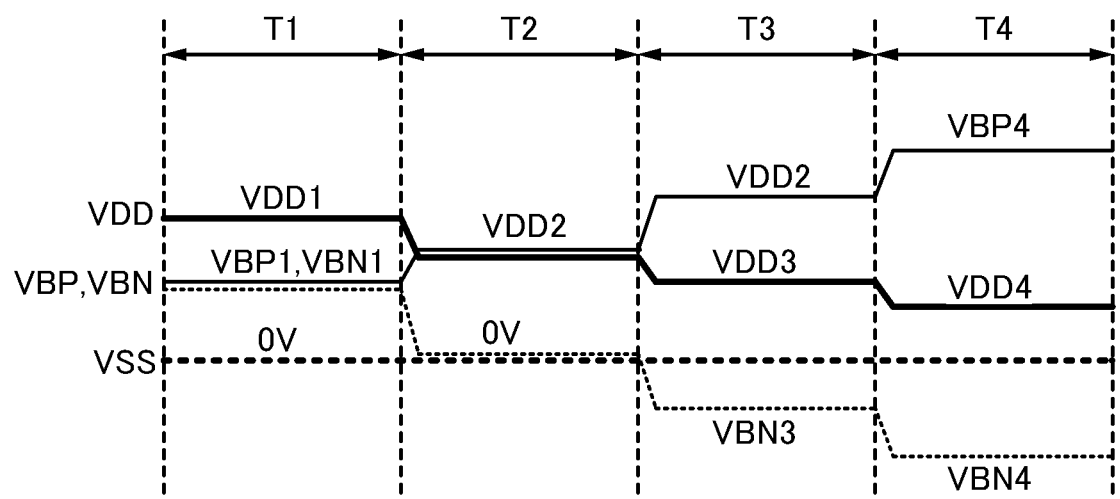
FIG. 7 is a diagram showing an operation example of a semiconductor device.

FIG. 7 is a diagram for explaining the magnitude relationships of the potentials shown in Table 1. In FIG. 7, the high-speed mode is shown as a period T1, the normal mode is shown as a period T2, the low-power mode is shown as a period T3, and the sleep mode is shown as a period T4.

In the period T1, the potentials VBN and VBP (shown by a thin solid line and a thin dashed line) are applied to the back gate electrode such that a power supply voltage VDD1–VSS (shown by a bold solid line and a bold dashed line) is large and the threshold voltage is low, whereby the on/off of each transistor can be switched at high speed. In the period T2, the potentials VBN and VBP are applied to the back gate electrode such that a power supply voltage VDD2–VSS is small as compared with the period T1 and the threshold voltage is high as compared with the period T1, whereby the threshold voltage of each transistor can be high, leading to a reduction in through current. In the period T3, the potentials VBN and VBP are applied to the back gate electrode such that a power supply voltage VDD3–VSS is small as compared with the period T2 and the threshold voltage is high as compared with the period T2, whereby the threshold voltage of each transistor can be high, leading to a further reduction in through current. In the period T4, the potentials VBN and VBP are applied to the back gate electrode such that a power supply voltage VDD4–VSS is small as compared with the period T3 and the threshold voltage is high as compared with the period T3, whereby the threshold voltage of each transistor can be high, leading to a further reduction in leakage current.

As described above, one embodiment of the present invention can provide a semiconductor device which is downsized by stacking a Si transistor and an OS transistor. Another embodiment of the present invention can provide a semiconductor device which functions as a low-power-consumption memory circuit by using a Si transistor and an OS transistor each including a back gate electrode for controlling the threshold voltage. Another embodiment of the present invention can provide a semiconductor device with a novel structure.

Embodiment 2

In this embodiment, a structure of an integrated circuit including the components of the semiconductor device 10 described in the above embodiment will be described with reference to FIG. 8 and FIG. 9.

Figure 8:
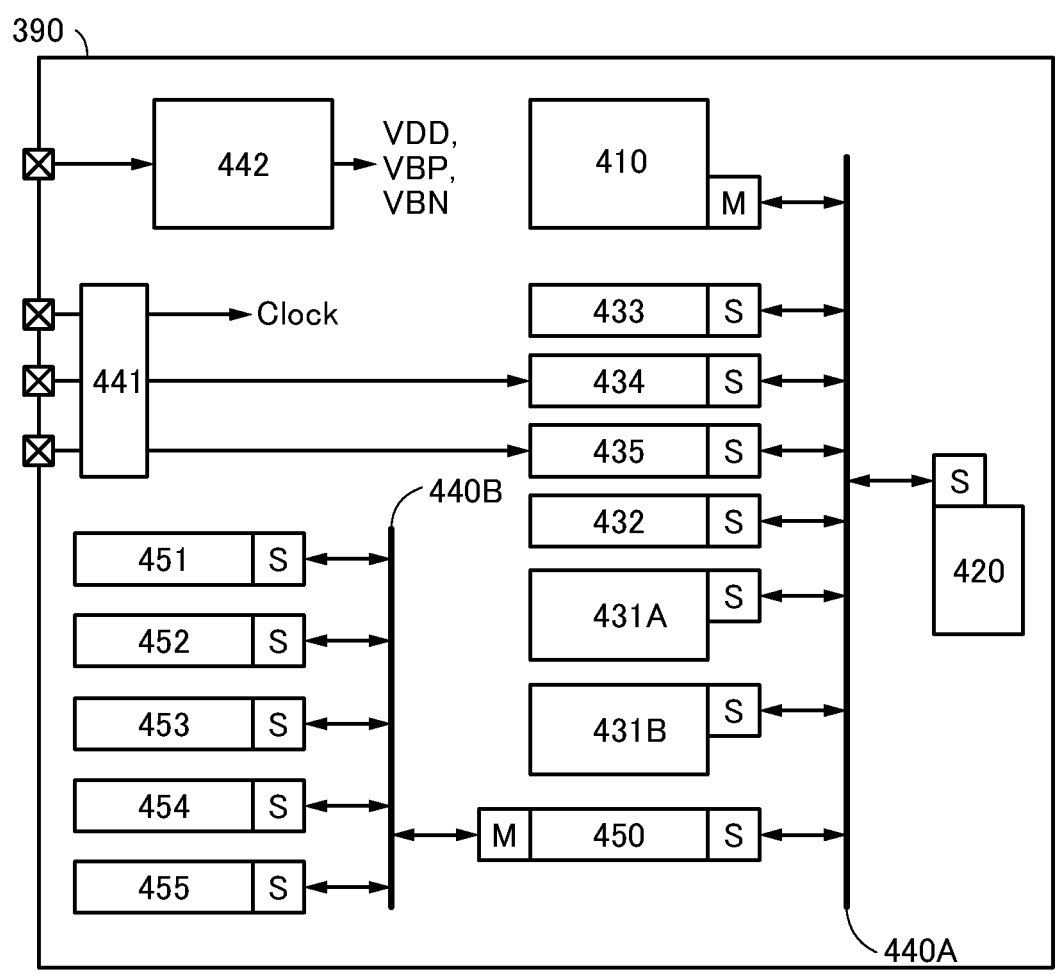
FIG. 8 is a diagram illustrating a configuration example of an integrated circuit.

FIG. 8 is an example of a block diagram illustrating the structure example of the integrated circuit including the components of the semiconductor device 10.

An integrated circuit 390 illustrated in FIG. 8 includes a CPU 410, an accelerator 420, an on-chip memory 431A, an on-chip memory 431B, a system controller 432, a power supply management circuit 433, a memory interface circuit 434, a GPIO (General Purpose Input/Output) 435, an input/output portion 441, a power supply circuit 442, a bus bridge circuit 450, a timer circuit 451, a watchdog circuit 452, a transmission/reception circuit 453, an interface circuit 454, and an interface circuit 455.

The CPU 410 with an indication of "M" in the drawing controls a device ("S" in the drawing) connected to a high-speed bus 440A. The CPU 410 can transmit and receive signals such as data and addresses through the high-speed bus 440A. The accelerator 420 has a circuit configuration in which arithmetic processing such as product-sum operation is repeated.

The high-speed bus 440A is a bus that transmits and receives various signals between the CPU 410 and other circuits at high speed. As an example, an AMBA (Advanced Microcontroller Bus Architecture)—AHB (Advanced High-performance Bus) can be used as the bus.

The on-chip memories 431A and 431B have a circuit configuration for storing data or a program that is input into and output from the circuit included in the integrated circuit 390, for example, the CPU 410 or the accelerator 420. As the on-chip memory 431A, a NOSRAM, which is an OS memory, can be used, for example. As the on-chip memory 431B, a nonvolatile memory using a Si transistor can be used, for example.

The system controller 432 has a circuit configuration for performing reset control of circuits in the integrated circuit 390 and lockup monitoring of systems.

The power supply management circuit 433 has a circuit configuration for controlling clock gating, power gating, or the like of a circuit, such as a CPU core, included in the integrated circuit 390.

The memory interface circuit 434 has a circuit structure for transmitting and receiving data to and from a memory device outside the integrated circuit 390.

A GPIO 435 has a circuit configuration for transmitting and receiving a signal to/from an external general-purpose device.

The input/output portion 441 has a circuit configuration for converting signals input to and output from the outside into predetermined forms. Furthermore, the input/output portion 441 supplies a clock signal (Clock) supplied from the outside to circuits in the integrated circuit 390.

The power supply circuit 442 is a circuit for generating a voltage used in the integrated circuit 390. For example, the power supply circuit 442 is a circuit that generates the potentials VDD, VBP, and VBN applied to a transistor.

A low-speed bus 440B is a bus for transmitting and receiving various signals between the timer circuit 451, the watchdog circuit 452, the transmission/reception circuit 453, the interface circuit 454, and the interface circuit 455 at low speed. As an example, an AMBA-APB (Advanced Peripheral Bus) can be used as the bus. Transmission and reception of various signals between the high-speed bus 440A and the low-speed bus 440B are performed through the bus bridge circuit 450. The bus bridge circuit 450 with an indication of "M" in the drawing controls a device ("S" in the drawing) connected to the low-speed bus 440B.

The timer circuit 451 and the watchdog circuit 452 each have a circuit configuration for performing interrupt processing with respect to a request received from a peripheral device.

The transmission/reception circuit 453, the interface circuit 454, and the interface circuit 455 each have a circuit structure for operating an interface such as a UART (Universal Asynchronous Receiver/Transmitter), an I2C (Inter-Integrated Circuit), or an SPI (Serial Peripheral Interface).

Figure 9A:
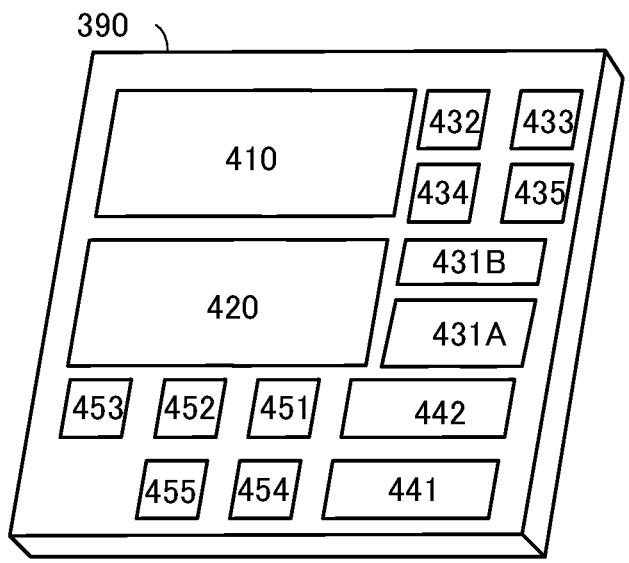
FIG. 9A and FIG. 9B are diagrams each illustrating a configuration example of an integrated circuit.
Figure 9B:
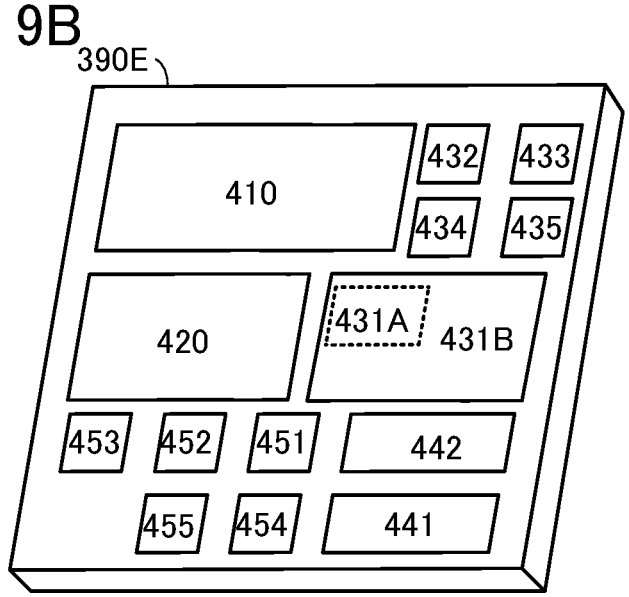

FIG. 9A and FIG. 9B are diagrams each illustrating an arrangement example of the circuit blocks when they are made into an SoC. As in the integrated circuit 390 illustrated in FIG. 9A, the components illustrated in the block diagram of FIG. 8 can be arranged on a chip by being divided into regions.

Note that the on-chip memory 431A illustrated in FIG. 8 can be configured with a memory circuit including an OS transistor, for example, a NOSRAM. That is, the on-chip memory 431A can be stacked over a transistor including a Si transistor. Therefore, when the SoC is made, the on-chip memory 431A and the on-chip memory 431B can be arranged in the same region by being integrated as in an integrated circuit 390E illustrated in FIG. 9B.

According to one embodiment of the present invention described above, a novel semiconductor device and electronic device can be provided. Alternatively, according to one embodiment of the present invention, a semiconductor device and an electronic device having low power consumption can be provided. Alternatively, according to one embodiment of the present invention, a semiconductor device and an electronic device capable of suppressing heat generation can be provided.

This embodiment can be combined with the description of the other embodiments as appropriate.

Embodiment 3

In this embodiment, an electronic device, a moving object, and an arithmetic system to which the integrated circuit 390 described in the above embodiment can be applied will be described with reference to FIG. 10 to FIG. 12.

Figure 10B:
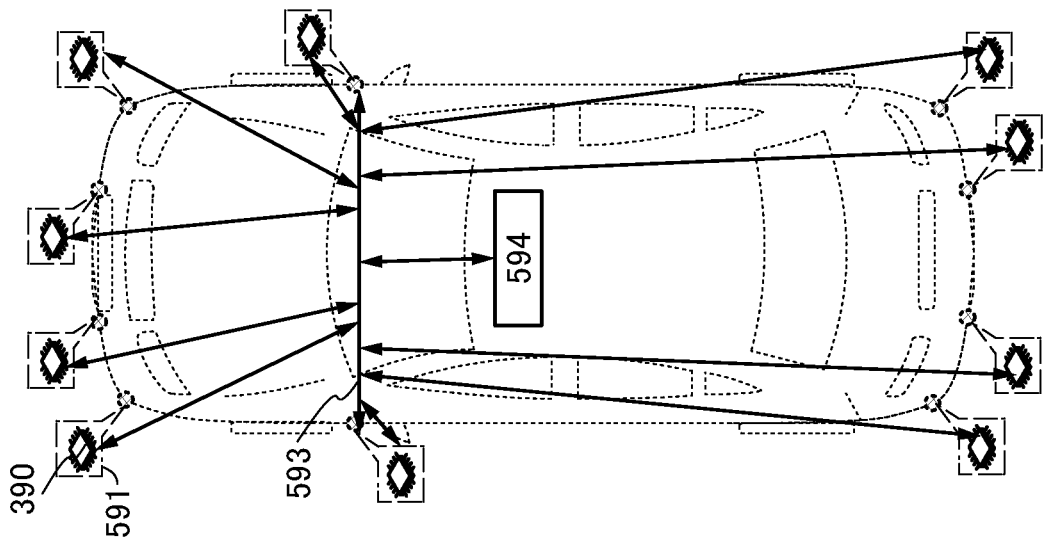
FIG. 10A and FIG. 10B are diagrams illustrating an application example of an integrated circuit.
Figure 10A:
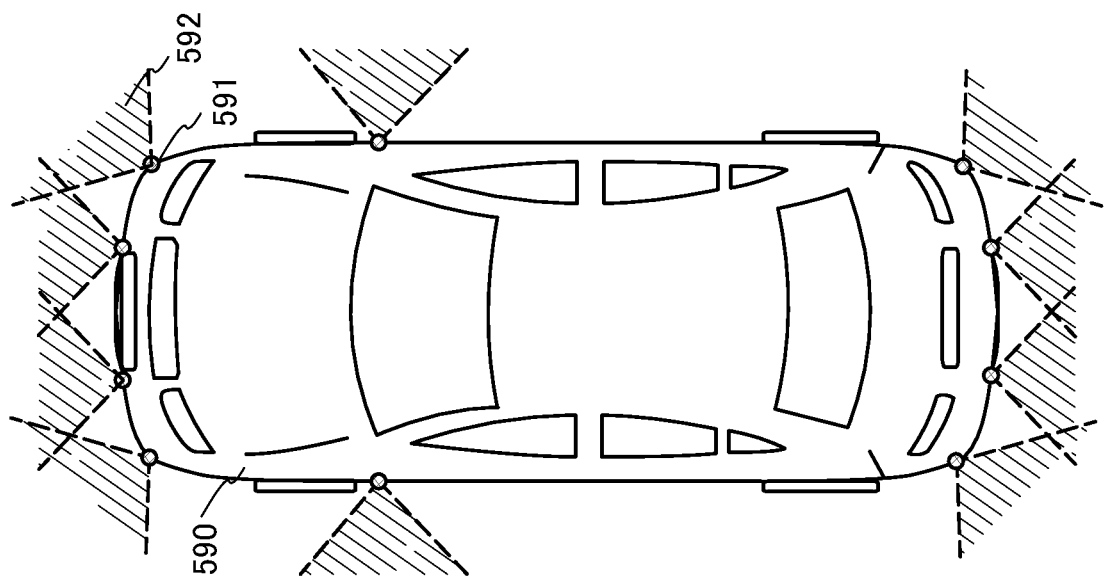

FIG. 10A illustrates an external view of an automobile as an example of a moving object. FIG. 10B is a simplified diagram illustrating data transmission in the automobile. An automobile 590 includes a plurality of cameras 591 and the like. The automobile 590 also includes various sensors such as an infrared radar, a millimeter wave radar, and a laser radar (not illustrated) and the like.

In the automobile 590, the above-described integrated circuit 390 can be used for the camera 591 and the like. The automobile 590 can perform autonomous driving by judging surrounding traffic information such as the presence of a guardrail or a pedestrian in such a manner that the camera 591 processes a plurality of images taken in a plurality of imaging directions 592 with the integrated circuit 390 described in the above embodiment and the plurality of images are analyzed together with a host controller 594 and the like through a bus 593 and the like. The integrated circuit 390 can be used for a system for navigation, risk prediction, or the like.

When arithmetic processing of a neural network or the like is performed on the obtained image data in the integrated circuit 390, for example, processing for the following can be performed: an increase in image resolution, a reduction in image noise, face recognition (for security reasons or the like), object recognition (for autonomous driving or the like), image compression, image compensation (a wide dynamic range), restoration of an image of a lensless image sensor, positioning, character recognition, and a reduction of glare and reflection.

Note that although an automobile is described above as an example of a moving vehicle, the moving vehicle is not limited to an automobile. Examples of moving objects also include a train, a monorail train, a ship, and a flying object (a helicopter, an unmanned aircraft (a drone), an airplane, and a rocket), and these moving objects can include a system utilizing artificial intelligence when equipped with a computer of one embodiment of the present invention.

Figure 11A:
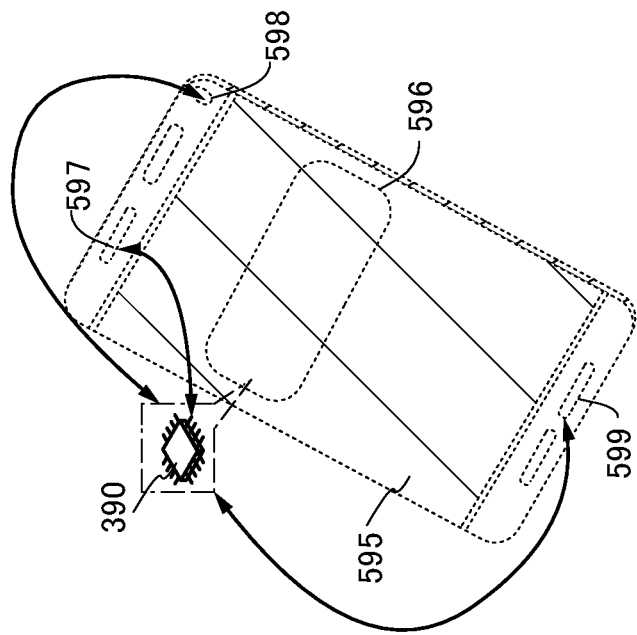
FIG. 11A and FIG. 11B are diagrams illustrating an application example of an integrated circuit.
Figure 11B:
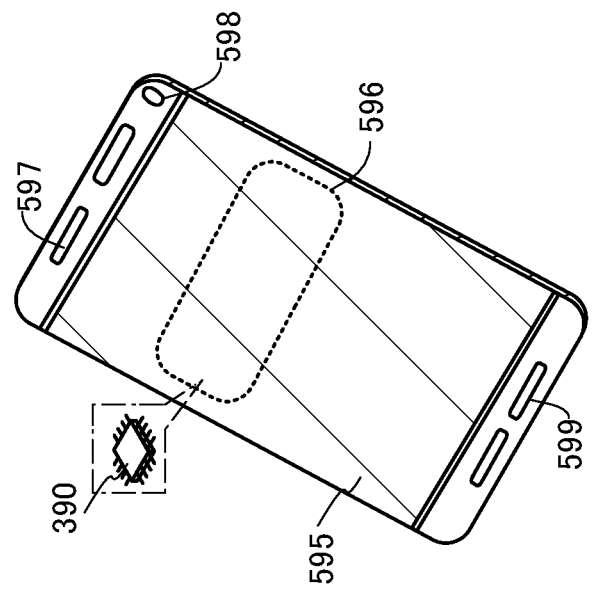

FIG. 11A is an external diagram illustrating an example of a portable electronic device. FIG. 11B is a simplified diagram illustrating data transmission in the portable electronic device. A portable electronic device 595 includes a printed wiring board 596, a speaker 597, a camera 598, a microphone 599, and the like.

In the portable electronic device 595, the printed wiring board 596 can be provided with the above-described integrated circuit 390. The portable electronic device 595 processes and analyzes a plurality of pieces of data obtained from the speaker 597, the camera 598, the microphone 599, and the like with the integrated circuit 390 described in the above embodiment, whereby the user's convenience can be improved. The integrated circuit 390 can be used for a system for voice guidance, image search, or the like.

When arithmetic processing of a neural network or the like is performed on the obtained image data in the integrated circuit 390, for example, processing for the following can be performed: an increase in image resolution, a reduction in image noise, face recognition (for security reasons or the like), object recognition (for autonomous driving or the like), image compression, image compensation (a wide dynamic range), restoration of an image of a lensless image sensor, positioning, character recognition, and a reduction of glare and reflection.

Figure 12A:
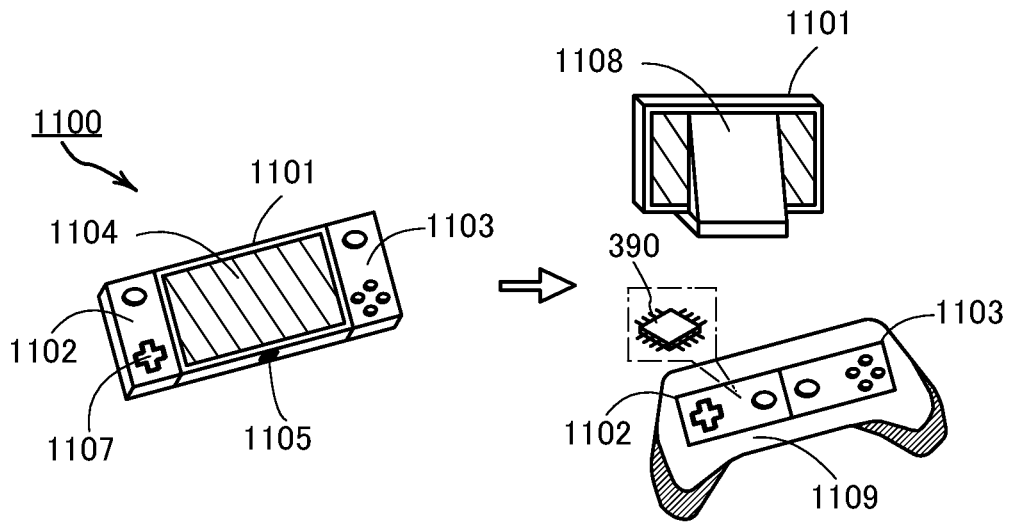
FIG. 12A, FIG. 12B, and FIG. 12C are diagrams each illustrating an application example of an integrated circuit.

A portable game machine 1100 illustrated in FIG. 12A includes a housing 1101, a housing 1102, a housing 1103, a display portion 1104, a connection portion 1105, operation keys 1107, and the like. The housing 1101, the housing 1102, and the housing 1103 can be detached. When the connection portion 1105 provided in the housing 1101 is attached to a housing 1108, an image to be output to the display portion 1104 can be output to another video device. Alternatively, the housing 1102 and the housing 1103 are attached to a housing 1109, whereby the housing 1102 and the housing 1103 are integrated and function as an operation portion. The integrated circuit 390 described in the above embodiment can be incorporated into a chip provided on a substrate in the housing 1102 and the housing 1103, for example.

Figure 12B:
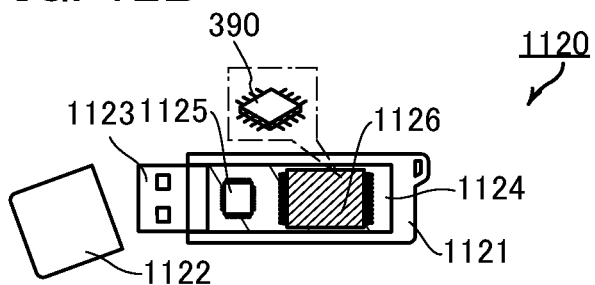

FIG. 12B is a USB connection stick type electronic device 1120. The electronic device 1120 includes a housing 1121, a cap 1122, a USB connector 1123, and a substrate 1124. The substrate 1124 is held in the housing 1121. For example, a memory chip 1125 and a controller chip 1126 are attached to the substrate 1124. The integrated circuit 390 described in the above embodiment can be incorporated into the controller chip 1126 or the like of the substrate 1124.

Figure 12C:
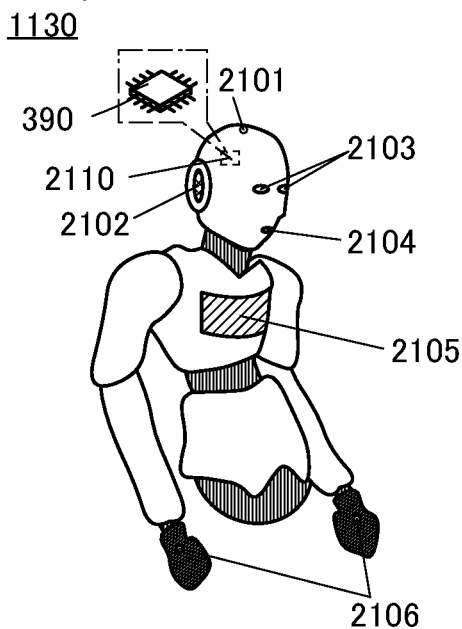

FIG. 12C is a humanoid robot 1130. The robot 1130 includes sensors 2101 to 2106 and a control circuit 2110. For example, the integrated circuit 390 described in the above embodiment can be incorporated into the control circuit 2110.

This embodiment can be combined with the description of the other embodiments as appropriate.

(Supplementary Notes on the Description in this Specification and the Like)

The description of the above embodiments and each structure in the embodiments are noted below.

One embodiment of the present invention can be constituted by combining, as appropriate, the structure described in each embodiment with the structures described in the other embodiments and Example. In addition, in the case where a plurality of structure examples are described in one embodiment, the structure examples can be combined as appropriate.

Note that content (or part of the content) described in one embodiment can be applied to, combined with, or replaced with another content (or part of the content) described in the embodiment and/or content (or part of the content) described in another embodiment or other embodiments.

Note that in each embodiment, a content described in the embodiment is a content described with reference to a variety of drawings or a content described with text disclosed in the specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

In addition, in this specification and the like, components are classified on the basis of the functions, and shown as blocks independent of one another in block diagrams. However, in an actual circuit or the like, it is difficult to separate components on the basis of the functions, and there are such a case where one circuit is associated with a plurality of functions and a case where a plurality of circuits are associated with one function. Therefore, blocks in the block diagrams are not limited by the components described in this specification, and the description can be changed appropriately depending on the situation.

In drawings, the size, the layer thickness, or the region is shown arbitrarily for description convenience. Therefore, they are not limited to the illustrated scale. Note that the drawings are schematically shown for clarity, and embodiments of the present invention are not limited to shapes or values shown in the drawings. For example, variation in signal, voltage, or current due to noise or variation in signal, voltage, or current due to difference in timing can be included.

Furthermore, the positional relationship between components illustrated in the drawings and the like is relative. Therefore, when the components are described with reference to drawings, terms for describing the positional relationship, such as "over" and "under", are sometimes used for convenience. The positional relationship of the components is not limited to that described in this specification and can be explained with other terms as appropriate depending on the situation.

In this specification and the like, expressions "one of a source and a drain" (or a first electrode or a first terminal) and "the other of the source and the drain" (or a second electrode or a second terminal) are used in the description of the connection relationship of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate according to circumstances.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

In this specification and the like, voltage and potential can be replaced with each other as appropriate. The voltage refers to a potential difference from a reference potential, and when the reference potential is a ground voltage, for example, the voltage can be rephrased into the potential. The ground potential does not necessarily mean 0 V. Note that potentials are relative, and the potential supplied to a wiring or the like is changed depending on the reference potential, in some cases.

In this specification and the like, a node can be referred to as a terminal, a wiring, an electrode, a conductive layer, a conductor, an impurity region, or the like depending on a circuit structure, a device structure, or the like. Furthermore, a terminal, a wiring, or the like can be referred to as a node.

In this specification and the like, the expression "A and B are connected" means the case where A and B are electrically connected. Here, the expression "A and B are electrically connected" means connection that enables electrical signal transmission between A and B in the case where an object (that refers to an element such as a switch, a transistor element, or a diode, a circuit including the element and a wiring, or the like) exists between A and B. Note that the case where A and B are electrically connected includes the case where A and B are directly connected. Here, the expression "A and B are directly connected" means connection that enables electrical signal transmission between A and B through a wiring (or an electrode) or the like, not through the above object. In other words, direct connection refers to connection that can be regarded as the same circuit diagram when indicated as an equivalent circuit.

In this specification and the like, a switch is in a conduction state (on state) or in a non-conduction state (off state) to determine whether current flows or not. Alternatively, a switch has a function of selecting and changing a current path.

In this specification and the like, channel length refers to, for example, the distance between a source and a drain in a region where a semiconductor (or a portion where current flows in a semiconductor when a transistor is in an on state) and a gate overlap with each other or a region where a channel is formed in a top view of the transistor.

In this specification and the like, channel width refers to, for example, the length of a portion where a source and a drain face each other in a region where a semiconductor (or a portion where current flows in a semiconductor when a transistor is in an on state) and a gate electrode overlap with each other or a region where a channel is formed.

Note that in this specification and the like, the terms "film", "layer", and the like can be interchanged with each other depending on the case or according to circumstances. For example, the term "conductive layer" can be changed into the term "conductive film" in some cases. As another example, the term "insulating film" can be changed into the term "insulating layer" in some cases.

REFERENCE NUMERALS

M21: transistor, M22: transistor, M23: transistor, M24: transistor, M26: transistor, T1: period, T2: period, T3: period, T4: period, VBN1: potential, VBN3: potential, VBN4: potential, VBP1: potential, VBP3: potential, VBP4: potential, Vctl_1: potential, Vctl_2: potential, VDD1: potential, VDD2: potential, VDD3: potential, VDD4: potential, Vin1: potential, 10: semiconductor device, 10A: semiconductor device, 10B: semiconductor device, 10C: semiconductor device, 10D: semiconductor device, 10E: semiconductor device, 20: memory cell array, 30: peripheral circuit, 31: control logic circuit, 32: column decoder, 33: output driver, 34: bit line driver circuit, 41: row decoder, 42: word line driver circuit, 43: predecoder, 45: watchdog circuit, 50: circuit, 51: precharge circuit, 52: sense amplifier circuit, 53: output MUX circuit, 54: driver circuit, 61: sense amplifier, 62: AND circuit, 63: analog switch, 64: analog switch, 99: memory system, 103A: transistor, 103B: transistor, 104A: transistor, 113: capacitor, 113A: transistor, 113B: transistor, 132: word line driver circuit, 142: bit line driver circuit, 147: circuit, 300: silicon substrate, 302: insulating layer, 305: well region, 306: well region, 306A: well region, 306B: well region, 308: insulating layer, 310A: impurity region, 310B: impurity region, 310C: channel formation region, 310D: impurity region, 310E: impurity region, 312: impurity region, 312A: impurity region, 312B: impurity region, 314: insulating layer, 316: conductive layer, 318: insulating layer, 322A: conductive layer, 322B: conductive layer, 322C: conductive layer, 322D: conductive layer, 324: insulating layer, 326: conductive layer, 328: insulating layer, 330: conductive layer, 332: insulating layer, 334: conductive layer, 336: insulating layer, 338: conductive layer, 340: insulating layer, 342: semiconductor layer, 344A: conductive layer, 344B: conductive layer, 346: insulating layer, 348: insulating layer, 350: insulating layer, 352: conductive layer, 354: insulating layer, 356: insulating layer, 358: conductive layer, 360: insulating layer, 362: conductive layer, 390: integrated circuit, 390E: integrated circuit, 410: CPU, 420: accelerator, 431A: on-chip memory, 431B: on-chip memory, 432: system controller, 433: power supply management circuit, 434: memory interface circuit, 440: high-speed bus, 440A: high-speed bus, 440B: low-speed bus, 441: input/output portion, 442: power supply circuit, 450: bus bridge circuit, 451: timer circuit, 452: watchdog circuit, 453: transmission/reception circuit, 454: interface circuit, 455: interface circuit, 590: motor vehicle, 591: camera, 592: imaging direction, 593: bus, 594: host controller, 595: portable electronic device, 596: printed wiring board, 597: speaker, 598: camera, 599: microphone, 1100: portable game machine, 1101: housing, 1102: housing, 1103: housing, 1104: display portion, 1105: connection portion, 1107: operation key, 1108: housing, 1109: housing, 1120: electronic device, 1121: housing, 1122: cap, 1123: USB connector, 1124: substrate, 1125: memory chip, 1126: controller chip, 1130: robot, 2101: sensor, 2106: sensor, 2110: control circuit

The invention claimed is:

1. A semiconductor device comprising a memory circuit comprising a first transistor and a second transistor,
   wherein the first transistor is formed on a silicon substrate,
   wherein the second transistor is formed in a layer above a layer where the first transistor is provided,
   wherein the first transistor comprises a first gate electrode and a first back gate electrode with a first channel formation region interposed therebetween,
   wherein the first gate electrode is electrically connected to one of a source and a drain of the second transistor,
   wherein one of a source and a drain of the first transistor is electrically connected to one of a source and a drain of a third transistor, wherein the third transistor comprises a third gate electrode and a third back gate electrode with a third channel formation region interposed therebetween,
wherein the first back gate electrode is electrically connected to the third back gate electrode, and
wherein the first back gate electrode is formed using a region where an impurity element imparting a conductivity type is selectively introduced in the silicon substrate.

2. The semiconductor device according to claim 1,
wherein the first transistor comprises an insulating layer between the first back gate electrode and the first channel formation region, and
wherein the insulating layer is an insulating layer formed with a buried oxide.

3. The semiconductor device according to claim 1,
wherein the second transistor comprises a second channel formation region, and
wherein the second channel formation region comprises a metal oxide.

4. The semiconductor device according to claim 3, wherein the metal oxide comprises In, Ga, and Zn.

5. The semiconductor device according to claim 1, wherein the second transistor comprises a second back gate electrode.

6. A semiconductor device comprising a memory circuit comprising a first transistor and a second transistor,
wherein a channel formation region of the first transistor is provided in a silicon substrate,
wherein the second transistor is formed above the first transistor,
wherein the first transistor comprises a first gate electrode and a first back gate electrode with a first channel formation region interposed therebetween,
wherein the first gate electrode is electrically connected to one of a source and a drain of the second transistor,
wherein one of a source and a drain of the first transistor is electrically connected to one of a source and a drain of a third transistor,
wherein the third transistor comprises a third gate electrode and a third back gate electrode with a third channel formation region interposed therebetween,
wherein the first back gate electrode is electrically connected to the third back gate electrode, and
wherein the first back gate electrode is formed using a region where an impurity element is selectively introduced in the silicon substrate.

7. The semiconductor device according to claim 6,
wherein the first transistor comprises an insulating layer between the first back gate electrode and the first channel formation region, and
wherein the insulating layer is an insulating layer formed with a buried oxide.

* * * * *